(12) United States Patent
Lee et al.

(10) Patent No.: US 11,935,779 B2
(45) Date of Patent: Mar. 19, 2024

(54) TRANSFER HAND AND SUBSTRATE PROCESSING APPARATUS WITH CONDUCTIVE RING AND TILTING VACUUM PAD

(71) Applicant: SEMES CO., LTD., Cheonan-si (KR)

(72) Inventors: Tae Hoon Lee, Osan-si (KR); Ju Won Kim, Cheonan-si (KR); Jin Sung Sun, Cheonan-si (KR); Bo Hee Lee, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/513,002

(22) Filed: Oct. 28, 2021

(65) Prior Publication Data

US 2022/0139756 A1    May 5, 2022

(30) Foreign Application Priority Data

Oct. 30, 2020    (KR) .................. 10-2020-0143571

(51) Int. Cl.
*H01L 21/677*    (2006.01)
*H01L 21/683*    (2006.01)
*H01L 21/687*    (2006.01)

(52) U.S. Cl.
CPC .... *H01L 21/6838* (2013.01); *H01L 21/67778* (2013.01); *H01L 21/68707* (2013.01)

(58) Field of Classification Search
CPC ........ B25J 9/042; B25J 9/043; B25J 15/0085; B25J 15/0608; B25J 15/0683;

(Continued)

(56) References Cited

U.S. PATENT DOCUMENTS 4,712,674 A * 12/1987 Young ............... H01L 21/67366
                                                                428/924
5,192,070 A *  3/1993 Nagai .................. B25J 15/0683
                                                                 271/90

(Continued)

FOREIGN PATENT DOCUMENTS

JP    S 52-55538 A    5/1977
JP    59-019310 A    1/1984

(Continued)

OTHER PUBLICATIONS

Fowler Associates, Inc. "Surface Resistivity and Triboelectricication" p. 5 https://view.officeapps.live.com/op/view.aspx?src=http%3A%2F%2Fesdjournal.com%2Ftechpapr%2Ftwenty1%2Ftribo.doc&wdOrigin=BROWSELINK accessed Jul. 12, 2022 (Year: 2000).*

(Continued)

*Primary Examiner* — Gerald McClain
(74) *Attorney, Agent, or Firm* — Harness, Dickey & Pierce, P.L.C.

(57) ABSTRACT

Various example embodiments provide a transfer hand for transferring a substrate. The transfer hand for transferring the substrate comprises: a body; and a vacuum assembly installed in the body and providing decompression to the bottom surface of a substrate to support the substrate at the upper part of the body; wherein the vacuum assembly comprises: an vacuum pad with conductivity contacting the substrate; and a sealing member provided between the vacuum pad and the body, the sealing member electrically connected to the vacuum pad; wherein the sealing member is grounded.

11 Claims, 14 Drawing Sheets

(58) Field of Classification Search
CPC .......... H01L 21/6838; H01L 21/67778; H01L 21/68707; H01L 21/67742
See application file for complete search history.

(56) References Cited

U.S. PATENT DOCUMENTS

| | | | |
|---|---|---|---|
| 7,384,083 B2 * | 6/2008 | Kent | H01L 21/6838 294/902 |
| 2010/0178137 A1 * | 7/2010 | Chintalapati | H01L 21/68707 414/222.01 |
| 2012/0235335 A1 * | 9/2012 | Hayashi | H01L 21/6838 269/21 |
| 2014/0169929 A1 * | 6/2014 | Inao | H01L 21/6838 414/800 |
| 2018/0350652 A1 * | 12/2018 | Matsuhira | H01L 21/677 |
| 2020/0273826 A1 * | 8/2020 | Kroetz | H01L 21/67144 |
| 2021/0347584 A1 * | 11/2021 | Hashima | G03F 7/162 |

FOREIGN PATENT DOCUMENTS

| | | |
|---|---|---|
| JP | 1-174385 A | 7/1989 |
| JP | 5-318368 A | 12/1993 |
| JP | H 08-017896 A | 1/1996 |
| JP | H-08-017896 A * | 1/1996 |
| JP | H 08-229865 A | 9/1996 |
| JP | 2001-341090 A | 12/2001 |
| JP | 2012-199282 A | 10/2012 |
| JP | 2014-72262 A | 4/2014 |
| JP | 5692302 B2 | 4/2015 |
| JP | 2016-157822 A | 9/2016 |
| JP | 2016-225410 A | 12/2016 |
| JP | 6349343 B2 | 6/2018 |
| JP | 2018-206814 A | 12/2018 |
| KR | 2007-0083333 A | 8/2007 |
| KR | 100810637 B1 | 3/2008 |
| KR | 100916532 B1 | 9/2009 |
| KR | 10-2012-0106586 A | 9/2012 |
| KR | 101882397 B1 | 7/2018 |
| KR | 10-2020-0030653 A | 3/2020 |
| WO | WO-2013021645 A1 | 2/2013 |

OTHER PUBLICATIONS

Professional Plastics "Electrical Properties of Plastic Materials" p. 2 https://www.professionalplastics.com/professionalplastics/ElectricalPropertiesofPlastics.pdf accessed Jul. 12, 2022 (Year: 2011).*
Korean Office Action dated Oct. 28, 2022 issued in Korean Patent Application No. 10- 2020-0143571.
Japanese Office Action dated Nov. 8, 2022 issued in Japanese Patent Application No. 2021-170851.

* cited by examiner

TRANSFER HAND AND SUBSTRATE PROCESSING APPARATUS WITH CONDUCTIVE RING AND TILTING VACUUM PAD

CROSS-REFERENCE TO RELATED APPLICATIONS

A claim for priority under 35 U.S.C. § 119 is made to Korean Patent Application No. 10-2020-0143571 filed on Oct. 30, 2020, in the Korean Intellectual Property Office, the entire contents of which are hereby incorporated by reference.

BACKGROUND

The exemplary embodiments of the inventive concept disclosed herein relate to a transfer hand and a substrate processing apparatus.

Various processes such as a photolithography process, an etching process, an ashing process, a thin film deposition process, and a cleaning process are carried out to manufacture a semiconductor device or a flat plate display panel. Among these processes, the photolithography process includes supplying a photoresist to a semiconductor substrate to form a photoresist film on a surface of the substrate, exposing the photoresist film using a photomask, and then supplying a developing liquid to the exposed photoresist film to obtain a desired pattern on the substrate. These processes are performed in process chambers. In addition, a general substrate processing apparatus has a plurality of transfer robots to take out the processed substrate from the process chamber or to bring the substrate into the process chamber.

In addition, a substrate such as a wafer transferred to and from the substrate processing apparatus may be charged by a friction with a treatment liquid supplied to the substrate and/or a friction with materials supporting or contacting the substrate (e.g., a spin chuck, a heating plate, etc.). When the charged substrate contacts the transfer hand of the transfer robot, an arcing may occur between the substrate and the transfer hand, which damages the substrate.

SUMMARY

Embodiments of the inventive concept provide a transfer hand and a substrate processing apparatus capable of efficiently transferring a substrate.

Embodiments of the inventive concept also provide a transfer hand and a substrate processing apparatus capable of minimizing the occurrence of arcing on a substrate when the transfer hand transfers the substrate.

Embodiments of the inventive concept provide a transfer hand and a substrate processing apparatus capable of appropriately adsorbing and supporting a substrate even when a warpage occurs on the substrate.

Embodiments of the inventive concept provide a transfer hand and a substrate processing apparatus capable of appropriately discharging a static electricity charged to a substrate.

Embodiments of the inventive concept provide a transfer hand and a substrate processing apparatus capable of minimizing damage to the substrate due to rapid electricity dissipation and electrostatic resistance charged on the substrate.

The technical objectives of the inventive concept are not limited to the above-described ones, the other unmentioned technical objects will become apparent to those skilled in the art from the following description.

In an aspect of the embodiments of the inventive concept, a transfer hand for transferring a substrate comprises: a body; and a vacuum assembly installed at the body and providing decompression to a bottom surface of the substrate to support the substrate at an upper surface of the body, wherein the vacuum assembly comprises: a conductive vacuum pad contacting the substrate; and a sealing member provided between the vacuum pad and the body and electrically connected to the vacuum pad, wherein the sealing member is grounded.

In some embodiments, the vacuum pad may be provided to be tiltable with respect to an axis perpendicular to an upper surface of the body.

In some embodiments, the body is grounded and the sealing member is electrically connected to the body and grounded.

In some embodiments, the sealing member may be provided as a material that has a resistance value smaller than the resistance value of the vacuum pad.

In some embodiments, the body is provided as a material that has a resistance value smaller than the resistance value of the sealing member.

In some embodiments, the vacuum pad comprises: a head portion contacting the bottom surface of the substrate; an insertion portion inserted in the body; and a contact portion formed between the head portion and the insertion portion and contacting the sealing member, and wherein the contact portion is provided in a curved shape.

In some embodiments, a radius of a curvature of the sealing member in a cross-section and a radius of a curvature of the contact unit in a cross-section are the same.

In some embodiments, the vacuum pad comprises: a hole in communication with a vacuum line, the vacuum line being provided in the body to provide decompression to the bottom surface of the substrate; and a ring protrusion formed at an edge area of an upper surface of the vacuum pad.

In some embodiments, the vacuum pad comprises at least one support protrusion formed at the upper surface of the vacuum pad and placed inside the ring protrusion.

In some embodiments, a height of a top end of the support protrusion is lower than a height of a top end of the ring protrusion.

In an aspect of the embodiments of the inventive concept, a transfer hand for transferring a substrate comprises: a body; and a vacuum assembly installed in the body and supporting the substrate, the vacuum assembly forming at least a part of a discharging path for removing electrostatic charges from the substrate; wherein the vacuum assembly comprises: a conductive vacuum pad contacting the substrate and provided to be tiltable with respect to an axis perpendicular to an upper surface of the body; and a conductive ring provided at the lower part of the vacuum pad and electrically connected to the vacuum pad.

In some embodiments, the conductive ring is provided as a material that has a resistance value smaller than a resistance value of the vacuum pad.

In some embodiments, the vacuum pad is provided as a material with a resistance value in the range of about $10^6$ ohms/sq to $10^9$ ohms/sq, wherein the conductivity ring is provided as a material with a resistance value in the range of about $10^3$ ohms/sq to $10^4$ ohms/sq.

In some embodiments, the vacuum pad comprises: a hole in communication with a vacuum line, the vacuum line being provided in the body and providing decompression to the lower surface of the substrate; a ring protrusion formed at an edge area of an upper surface of the vacuum pad; and a plurality of support protrusions provided at the upper surface of the vacuum pad and placed further inside than the ring protrusion, wherein a height of a top end of the support protrusions is lower than a height of a top end of the ring protrusion.

In some embodiments, the support protrusions are circumferentially spaced apart from one another at the upper surface of the vacuum pad.

In some embodiments, the body further comprises a base with a seating portion for seating the conductivity ring thereon, wherein the conductivity ring, and a radius of a curvature of the conductivity ring in a cross-section is smaller than a radius of a curvature of the seating portion in a cross-section.

In some embodiments, the vacuum assembly comprises a fixing member to prevent the vacuum pad from deviating from the base, wherein the fixing member comprises: a main body portion inserted into a penetration hole formed at the vacuum pad; and a locking portion extending laterally from the main body portion such that the locking portion overlaps with the base when seen from above.

In an aspect of the embodiments of the inventive concept, a substrate processing apparatus comprises: an index module with a load port on which a container storing a substrate is placed; and a processing module for performing treatment process on the substrate, wherein a robot with a transfer hand for transferring the substrate is provided at the index module and/or the processing module, wherein the transfer hand comprises: a body with a finger, a main body, and a base installed at the finger or the main body; and a vacuum assembly installed at the body and supporting the substrate at an upper surface of the body by vacuum pressure a bottom surface of the substrate, wherein the vacuum assembly comprises: a conductive vacuum pad contacting the substrate and provided to be tiltable with respect to an axis perpendicular to the upper surface of the body; and a conductive ring provided between the vacuum pad and the base, and contacting and electrically connecting to the vacuum pad and the base, wherein the base is electrically connected to the main body or the finger, the main body or the finger being grounded.

In some embodiments, the base is provided as an aluminum material, a surface of the base coated with a material including nickel, wherein the conductive ring is provided as a material including fluoride-based resin, and wherein the vacuum pad is provided as a material including conductive plastic.

In some embodiments, the substrate processing apparatus further comprises an interface module which connects the processing module and an outer processing apparatus which performs treatment process different from the processing module, wherein any one of the index module, the processing module, and the interface module is provided with a robot with the transfer hand.

In an embodiment of the inventive concept, a substrate may be efficiently transferred.

Additionally, in an embodiment of the inventive concept, the occurrence of arcing on the substrate when the transfer hand transfers the substrate may be minimized.

Additionally, in an embodiment of the inventive concept, even if a warpage is generated on the substrate, the transfer hand may appropriately adsorb and support the substrate.

Additionally, in an embodiment of the inventive concept, static electricity charged on the substrate may be appropriately discharged.

Additionally, in an embodiment of the inventive concept, it is possible to minimize damage to the substrate due to rapid electricity dissipation when discharging the static electricity charged substrate.

The effects of the inventive concept are not limited to the above-described effects, and effects not mentioned may be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
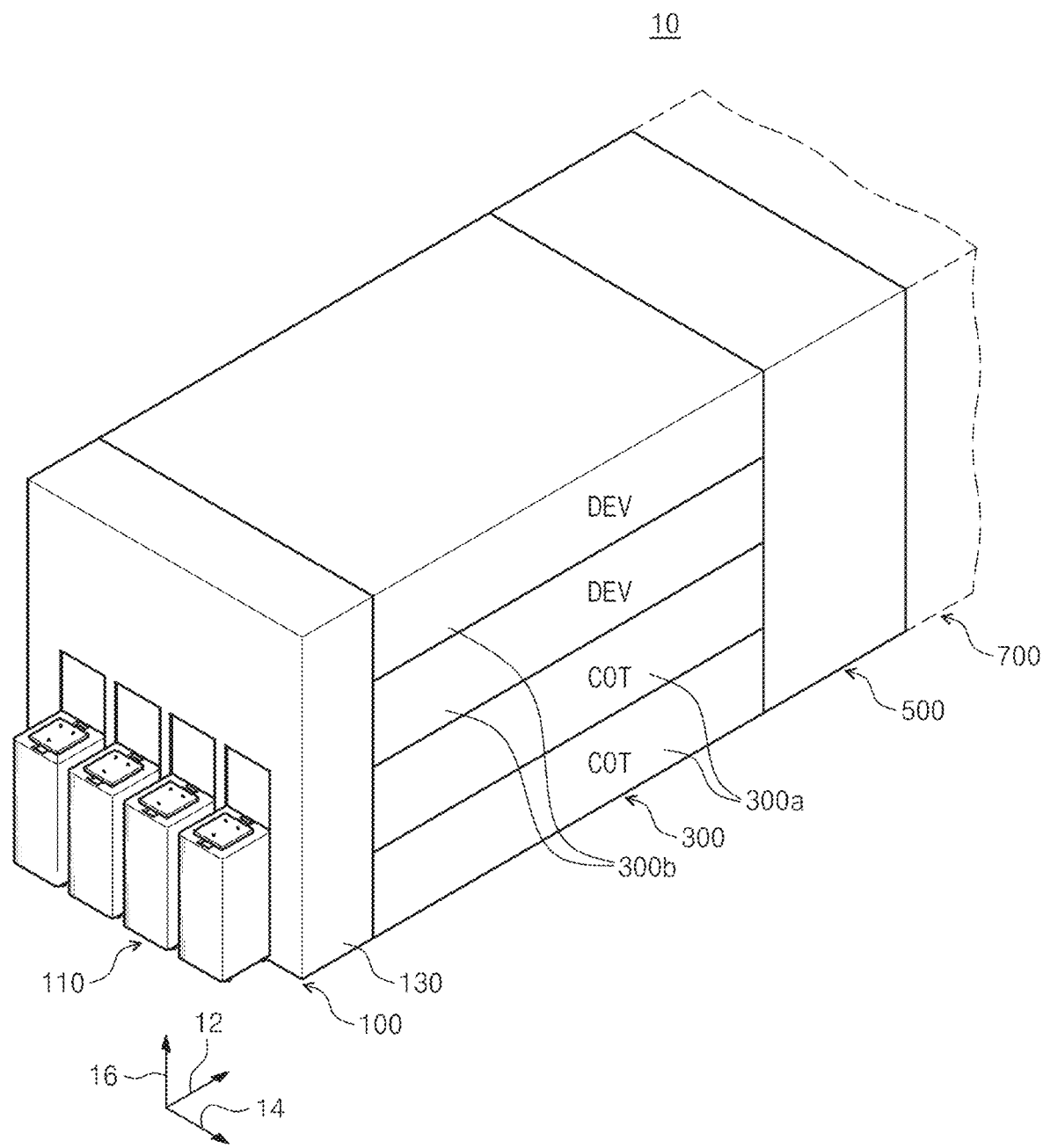
FIG. 1 is a view illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprise(s)", "comprising,", "include(s)", "including", "have", "having", etc., when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Hereinafter, an embodiment of the inventive concept will be illustrated with reference to FIG. 1 to FIG. 18.

Figure 2:
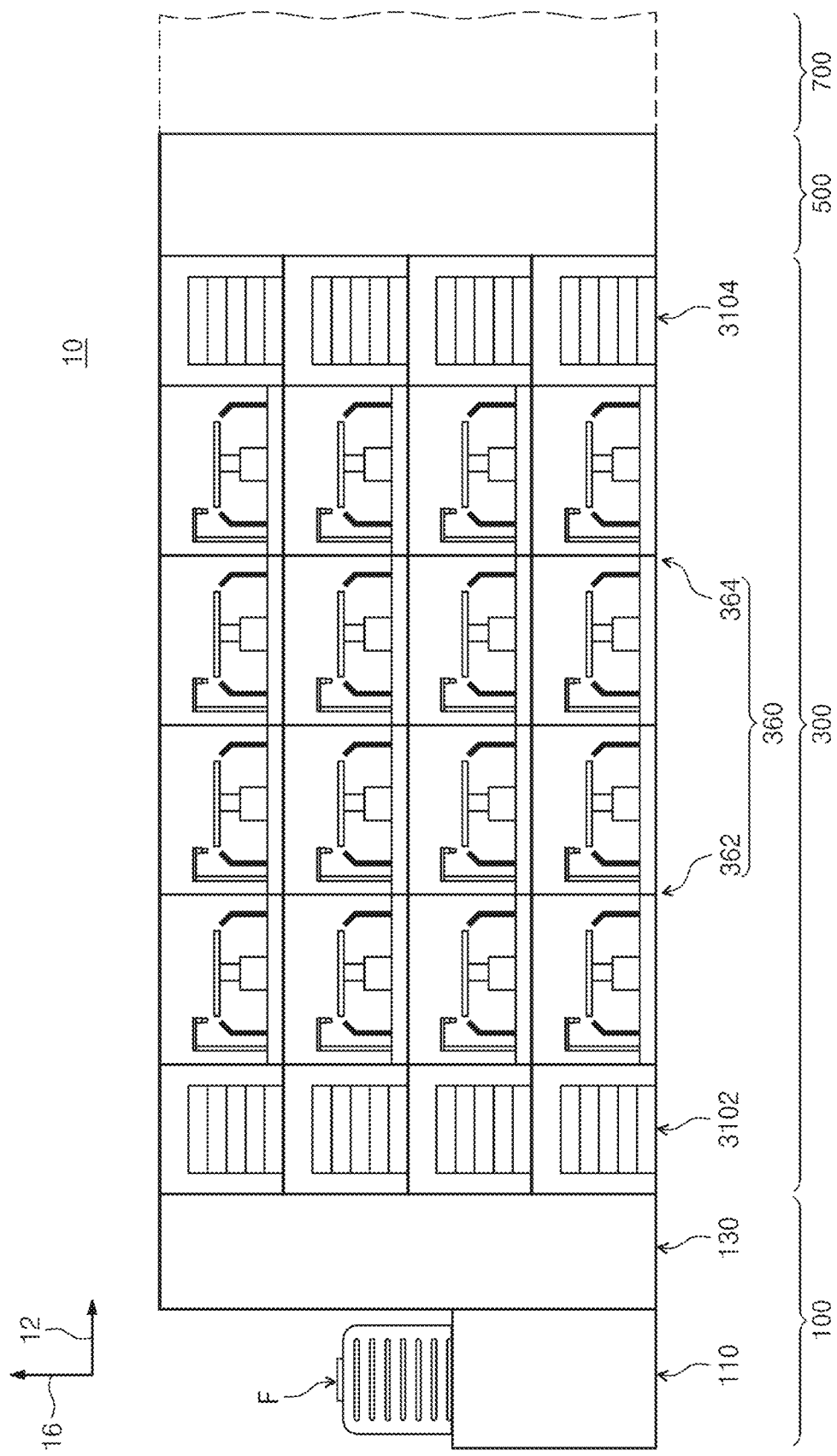
FIG. 2 is a cross-sectional view of a substrate processing apparatus showing a coating block or a developing block of FIG. 1.
Figure 3:
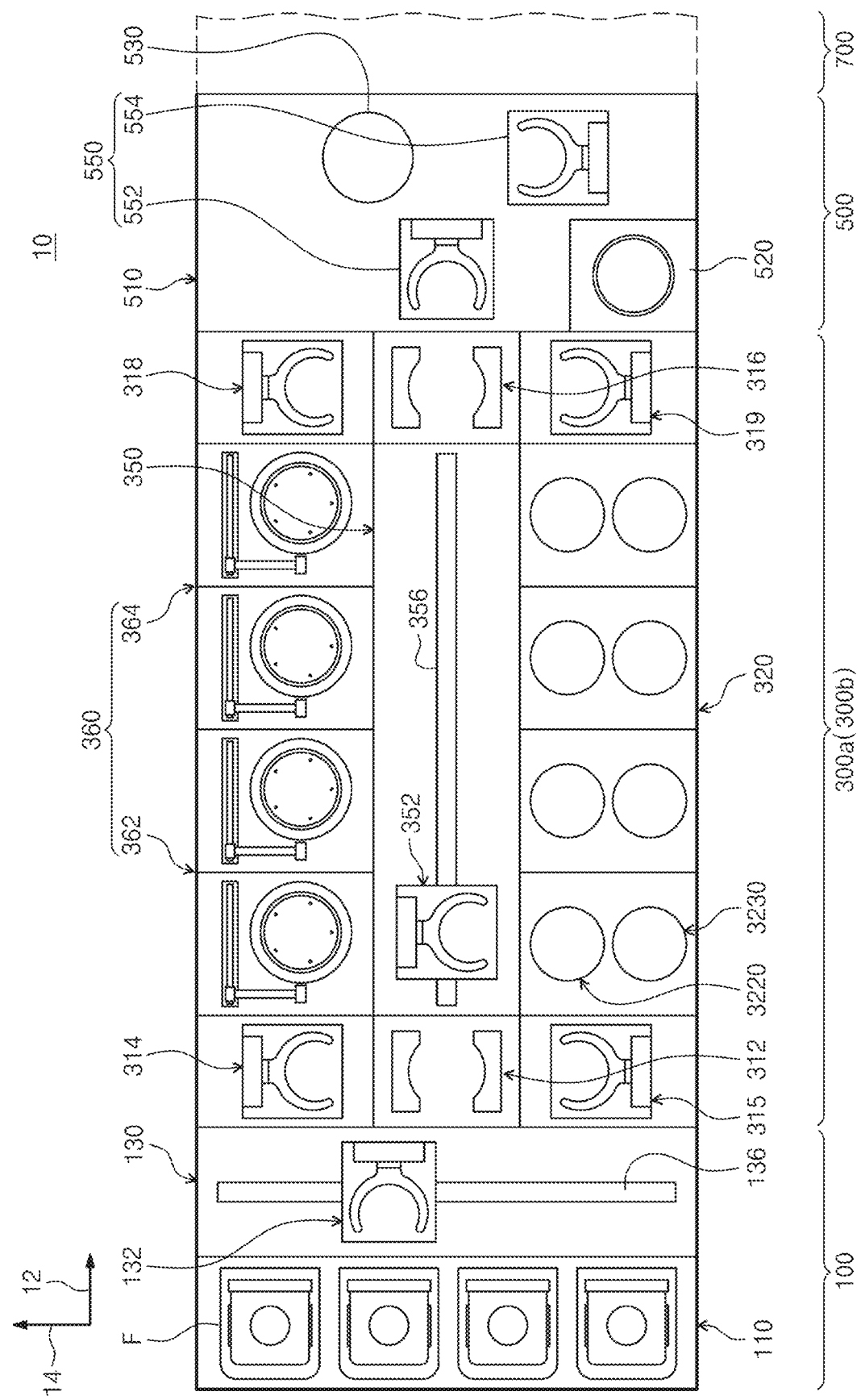
FIG. 3 is a plan view of the substrate processing apparatus of FIG. 1.

FIG. 1 illustrates a substrate processing apparatus according to an embodiment of the inventive concept, FIG. 2 illustrates a coating block or a developing block of FIG. 1, and FIG. 3 shows the substrate processing apparatus of FIG. 1.

Referring to FIG. 1 to FIG. 3, the substrate processing apparatus 10 according to an embodiment of the inventive concept comprises an index module 100, a processing module 300, and an interface module 500. According to an embodiment, the index module 100, the processing module 300, and the interface module 500 are sequentially arranged in a row. Hereinafter, a direction in which the index module 100, the processing module 300, and the interface module 500 are arranged will be referred to as a first direction 12, a direction that is perpendicular to the first direction when viewed from above will be referred to as a second direction 14, and a direction that is perpendicular to both the first direction 12 and the second direction 14 will be referred to as a third direction 16.

The index module 100 transfers the substrate W from the container F in which the substrate W is stored to the processing module 300, and gets the processed substrate W from the processing module 300 to be stored in the container F. The index module 100 is provided with its length extending along the second direction 14. The index module 100 has a load port 110 and an index frame 130. The index frame 130 is placed between the load port 110 and the processing module 300. The container F in which the substrates W are stored is placed at the load port 110. A plurality of load ports 110 may be provided, and the plurality of load ports 110 may be placed along the second direction 14.

For the container F, a closing-type container F such as a front open unified pod (FOUP) can be used. The container F can be placed on the load port 110 by a transfer means (not shown) such as an overhead transfer, an overhead conveyor, or an automatic guided vehicle, or the container F may be placed on the load port 110 by an operator.

An index robot 132 is provided inside the index frame 130. In the index frame 130, a guide rail 136 is provided with its length extending along the second direction 14, and the index robot 132 may be provided movable on the guide rail 136. The index robot 132 includes a hand on which the substrate W is placed, and the hand may be provided to be forwardly and backwardly movable, rotatable with the third direction 16 as an axis, and movable along the third direction 16.

The processing module 300 may perform a coating process and a developing process on the substrate W. The processing module 300 may receive the substrate W stored in the container F and perform a substrate processing process. The processing module 300 has a coating block 300a and a developing block 300b. The coating block 300a performs a coating process on the substrate W, and the developing block 300b performs a developing process on the substrate W. A plurality of the coating blocks 300a are provided, and the plurality of coating blocks 300a are provided to be stacked one above another. A plurality of the developing blocks 300b are provided, and the plurality of developing blocks 300b are provided to be stacked one above another. According to an embodiment of FIG. 1, two coating blocks 300a are provided, and two developing blocks 300b are provided. The coating blocks 300a may be disposed under the developing blocks 300b. In an embodiment, the two coating blocks 300a perform the same process and may be provided in the same structure. In addition, the two developing blocks 300b perform the same process and may be provided in the same structure.

Referring to FIG. 3, the coating block 300a includes a heat treatment chamber 320, a transfer chamber 350, a liquid treatment chamber 360, and buffer chambers 312 and 316. The heat treatment chamber 320 may be chambers for performing a heat treatment process on the substrate W. The heat treatment process may include a cooling process and a heating process. The liquid treatment chamber 360 supplies liquid onto the substrate W to form a liquid layer. The liquid layer may be a photoresist film or an anti-reflection film. The transfer chamber 350 transfers the substrate W between the heat treatment chamber 320 and the liquid treatment chamber 360 in the coating block 300a.

The transfer chamber 350 is provided with its length parallel to the first direction 12. A transfer robot 352 is provided in the transfer chamber 350. The transfer robot 352 transfers the substrate among the heat treatment chamber 320, the liquid treatment chamber 360, and the buffer chambers 312 and 316. In an embodiment, the transfer robot 352 has a hand on which the substrate W is placed, and the hand may be provided to be forwardly and backwardly movable, rotatable with the third direction 16 as an axis, and movable along the third direction 16. A guide rail 356 is provided in the transfer chamber 350 with its length parallel to the first direction 12, and the transfer robot 352 may be provided to be movable on the guide rail 356.

A plurality of heat treatment chambers 320 are provided. The heat treatment chambers 320 are arranged along the first direction 12. The heat treatment chambers 320 are placed on one side of the transfer chamber 350.

Figure 4:
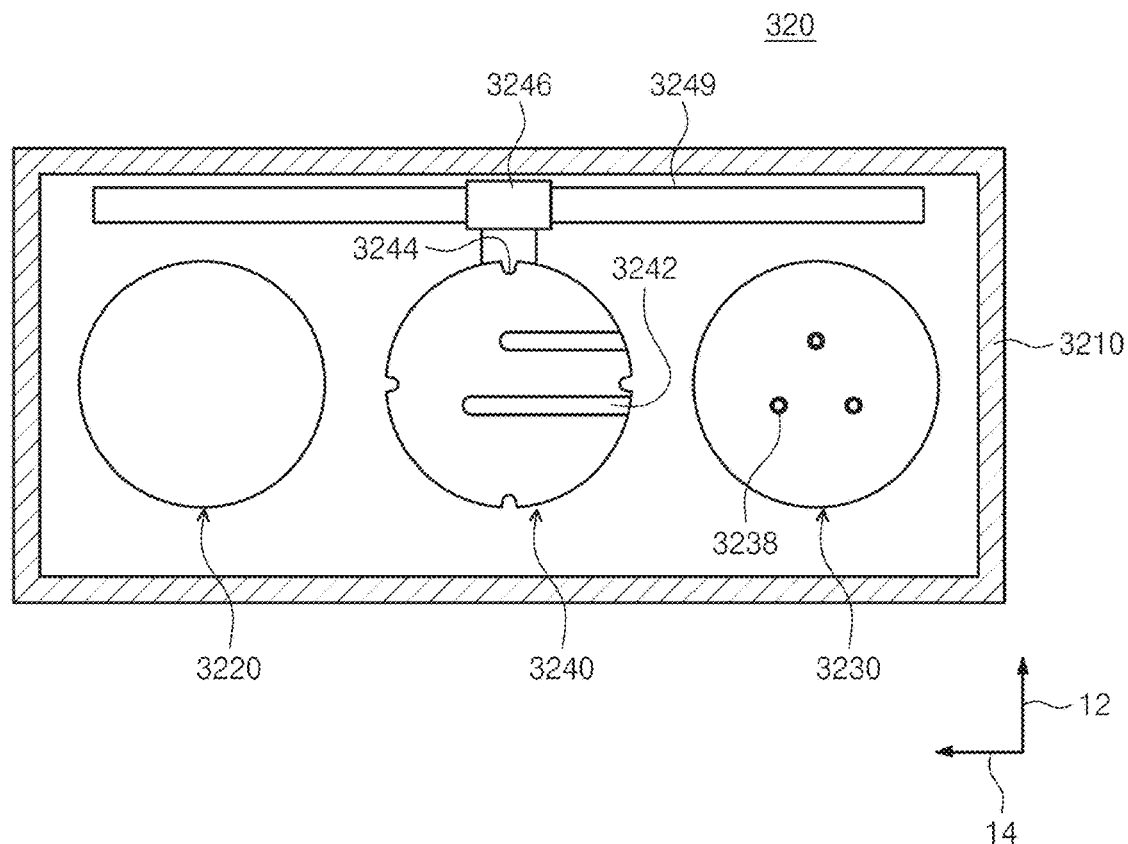
FIG. 4 is a plan view schematically illustrating an embodiment of a heat treatment chamber of FIG. 3.
Figure 5:
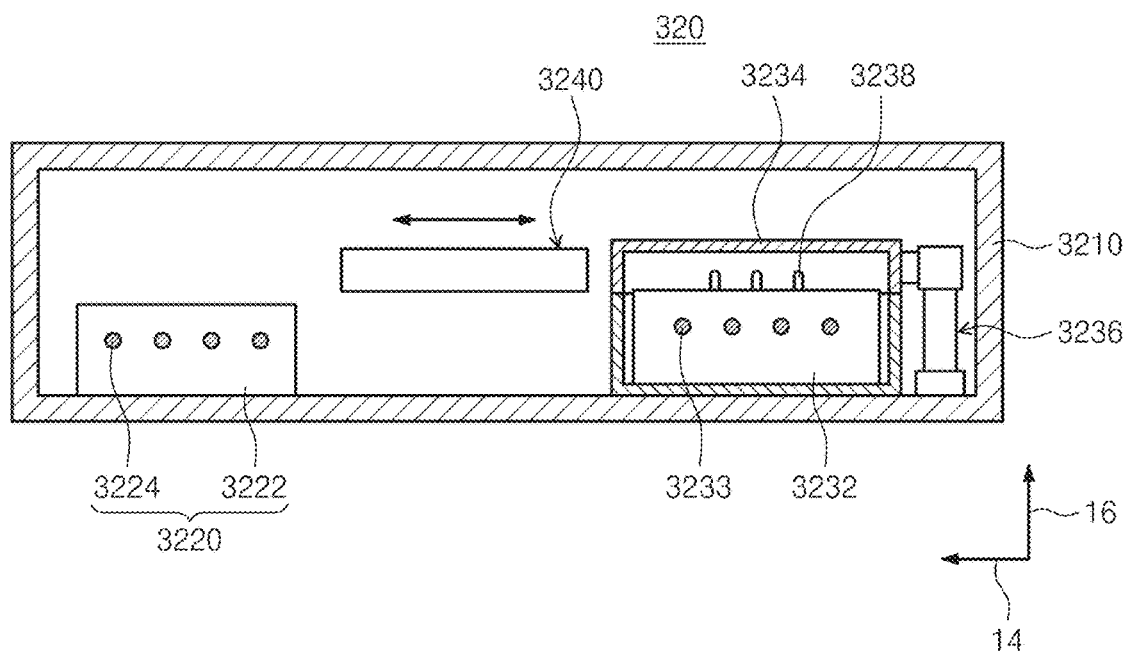
FIG. 5 is a front view of the heat treatment chamber of FIG. 4.

FIG. 4 shows the heat treatment chamber of FIG. 3, and FIG. 5 shows the heat treatment chamber of FIG. 4 according to an embodiment of the inventive concept.

Referring to FIG. 4 and FIG. 5, the heat treatment chamber 320 includes a housing 3210, a cooling unit 3220, a heating unit 3230, and a transfer plate 3240.

The housing 3210 is provided in a substantially rectangular parallelepiped shape. An inlet (not shown) through which the substrate W enters and exits is provided on the sidewall of the housing 3210. The inlet may remain open. Alternatively, a door (not shown) may be provided to open and close the inlet. The cooling unit 3220, the heating unit 3230, and the transfer plate 3240 are provided in the housing 3210. The cooling unit 3220 and the heating unit 3230 are provided side by side along the second direction 14. In an embodiment, the cooling unit 3220 may be placed closer to the transfer chamber 350 than the heating unit 3230.

The cooling unit 3220 has a cooling plate 3222. The cooling plate 3222 may have a substantially circular shape when viewed from above. The cooling plate 3222 is provided with a cooling member 3224. In an embodiment, the cooling member 3224 is formed inside the cooling plate 3222 and may be provided as a passage through which the cooling fluid flows.

The heating unit 3230 has a heating plate 3232, a cover 3234, and a heater 3233. The heating plate 3232 has a generally circular shape when viewed from above. The heating plate 3232 has a larger diameter than the substrate W. The heating plate 3232 is equipped with a heater 3233. The heater 3233 may be implemented with a resistance heating element to which an electric current is applied. The heating plate 3232 is provided with lift pins 3238 that may be vertically movable along the third direction 16. The lift pins 3238 receive the substrate W from the transfer means outside the heating unit 3230 and place the substrate W down on the heating plate 3232 or raise the substrate W off the heating plate 3232 and transfer the substrate W to the transfer means outside the heating unit 3230. In an embodiment, three lift pins 3238 may be provided. The cover 3234 has a space therein, which is open at the bottom. The cover 3234 is located over the heating plate 3232 and is vertically moved by the driver 3236. A space formed together with the heating plate 3232 by moving the cover 3234 serves as a heating space in which the substrate W is heated.

The transfer plate 3240 has a substantially circular shape and has a diameter corresponding to that of the substrate W. A notch 3244 is formed at an edge of the transfer plate 3240. The notch 3244 may have a shape corresponding to the protrusion 3543 formed on the hand 354 of the transfer robot 352. In addition, as many notches 3244 as the protrusion 3543 formed on the hand 354 are formed in a position corresponding to the protrusions 3543. When the vertical positions of the hand 354 and the transfer plate 3240 aligned with each other in the up/down direction are changed, the substrate W is transferred between the hand 354 and the transfer plate 3240. The transfer plate 3240 may be mounted on the guide rail 3249 and is movable between a first region 3212 and a second region 3214 along the guide rail 3249 by the driver 3246. A plurality of guide grooves 3242 in a slit shape are provided in the transfer plate 3240. The guide grooves 3242 extend inward from the edge of the transfer plate 3240. The guide grooves 3242 are provided with their length extending along the second direction 14, and the guide grooves 3242 are located to be spaced apart from each other along the second direction 14. The guide groove 3242 prevents the transfer plate 3240 and the lift pin 3238 from interfering with each other when the substrate W is handed over between the transfer plate 3240 and the heating unit 3230.

The substrate W is cooled in a state in which the transfer plate 3240 having the substrate W placed thereon is brought into contact with the cooling plate 3222. For efficient heat transfer between the cooling plate 3222 and the substrate W, the transfer plate 3240 is formed of a material having high heat conductivity. In an embodiment, the transfer plate 3240 may be formed of a metallic material.

The heating unit 3230 provided in some of the heat treatment chambers 320 may supply gas while heating the substrate W to improve the adhesion of the photoresist to the substrate W. In an embodiment, the gas may be hexamethyldisilane (HMDS) gas.

A plurality of liquid treatment chambers 360 are provided. Some of the liquid treatment chambers 360 may be stacked on each other. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Some other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid onto the substrate W, and each of the rear liquid treatment chambers 364 applies a second liquid onto the substrate W. The first liquid and the second liquid may be different types of liquid. In an embodiment, the first liquid may be a liquid for forming an anti-reflection layer, and the second liquid may be a liquid for forming a photoresist layer. The photoresist liquid may be applied onto the substrate W coated with the anti-reflection film. Alternatively, the first liquid may be a photoresist liquid, and the second liquid may be a liquid for forming an anti-reflection layer. In this case, the liquid for forming the anti-reflection layer may be applied onto the substrate W coated with photoresist layer. Alternatively, the first liquid and the second liquid may be the same kind of liquid, and both the first liquid and the second liquid may be liquids for forming photoresist layer.

Figure 6:
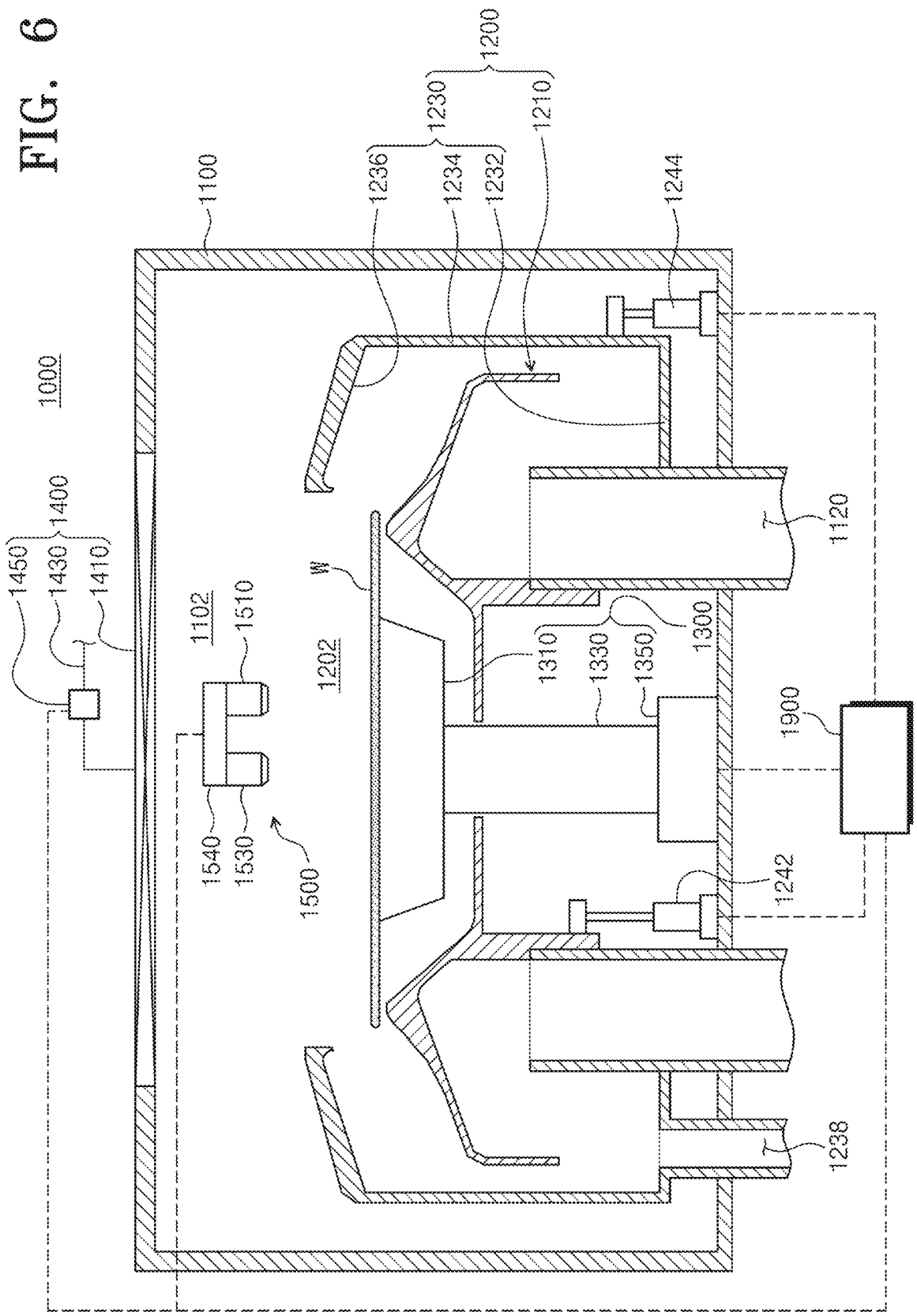
FIG. 6 is a view schematically illustrating an embodiment of a substrate processing apparatus provided in a liquid processing chamber of FIG. 4.
Figure 7:
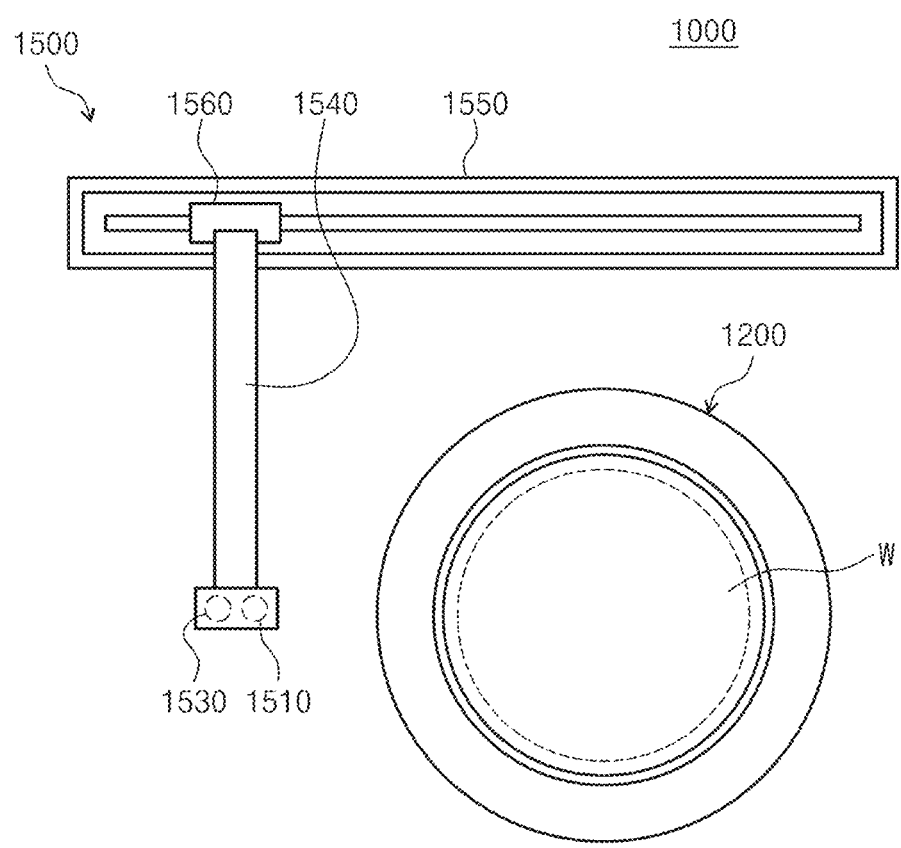
FIG. 7 is a plan view of the liquid treatment chamber of FIG. 6.

FIG. 6 is a schematic view illustrating one example of the substrate processing apparatus provided in the liquid treatment chamber of FIG. 4, and FIG. 7 is a plan view of the liquid treatment chamber of FIG. 6.

Referring to FIG. 6 and FIG. 7, a substrate processing apparatus 1000 for processing a substrate W may be provided in the liquid treatment chamber 360. The substrate processing apparatus 100 for performing liquid treatment on the substrate W may be provided in the liquid treatment chamber 360.

The substrate processing apparatus 1000 provided in the liquid treatment chamber 360 may include a housing 1100, a processing container 1200, a support unit 1300, a flow supply unit 1400, a liquid supply unit 1500, and a controller 1900.

The housing 1100 may have an inner space 1102. The housing 1100 may be provided in a rectangular container shape having an inner space 1102. An opening (not shown) may be formed in a sidewall of the housing 1100. The opening may function as an entrance/exit opening through which the substrate W enters or exits the inner space 1102.

In addition, in order to selectively open or close the opening, a door (not shown) may be provided in a region adjacent to the opening. The door may close the opening to seal the inner space 1102 from outside while a treatment process is performed on the substrate W placed in the inner space 1102.

The processing container 1200 may be disposed in the inner space 1102. The processing container 1200 may have a processing space 1202. That is, the processing container 1200 may be a bowl having the processing space 1202. Accordingly, the inner space 1102 may be provided to surround the processing space 1202. The processing container 1200 may have a cup shape with an open top. The processing space 1202 of the processing container 1200 may be a space in which a support unit 1300, which will be described below, supports and rotates the substrate W. The processing space 1202 may be a space in which the liquid supply unit 1500 and the wetting unit 1600 supply processing medium to process the substrate W.

The processing container 1200 may include an inner cup 1210 and an outer cup 1230. The outer cup 1230 may be provided to surround the circumference of the support unit 1300, and the inner cup 1210 may be located inside the outer cup 1230. Each of the inner cup 1210 and the outer cup 1230 may have an annular ring shape when viewed from above. The space between the inner cup 1210 and the outer cup 1230 may function as are collecting passage through which the processing medium introduced into the treatment space 1202 is recollected.

When viewed from above, the inner cup 1210 may be provided in a shape surrounding a rotation shaft 1330 of the support unit 1300 to be described later. For example, the inner cup 1210, when viewed from above, may be provided in a circular plate shape surrounding the rotation shaft 1330. When viewed from above, the inner cup 1210 may be located to overlap an exhaust port 1120 coupled to the housing 1100. The inner cup 1210 may have an inner part and an outer part. The upper surfaces of each of the inner and outer parts may be provided to have different angles with respect to a virtual horizontal line. For example, when viewed from above, the inner part may be located to overlap a support plate 1310 of the support unit 1300 to be described later. The inner part may be located to face the rotation shaft 1330. The upper surface of the inner part may be inclined upward away from the rotation shaft 1330, and the outer part may extend outwardly from the inner part. The upper surface of the outer part may be inclined downward from the rotation shaft 1330. The upper end of the inner part may coincide with a lateral end part of the substrate W in an up/down direction. In an embodiment, the point where the outer part and the inner part meet each other may be located in a lower position than the upper end of the inner part. The point where the inner part and the outer part meet each other may be provided to be rounded. The outer part may be combined with the outer cup 1230 to form the recollecting passage through which the processing medium such as a treatment liquid or a wetting medium is recollected.

The outer cup 1230 may be provided in a cup shape surrounding the support unit 1300 and the inner cup 1210. The outer cup 1230 may have a bottom portion 1232, a lateral portion 1234, and an inclined portion 1236. The bottom portion 1232 may have a circular plate shape having an empty space. A recollecting line 1238 may be connected to the bottom portion 1232. The recollecting line 1238 may be used to recollect the processing medium supplied onto the substrate W. The processing medium recollected by the recollect line 1238 may be reused by an external regeneration system. The lateral portion 1234 may have an annular ring shape surrounding the support unit 1300. The lateral portion 1234 may extend from a lateral end of the bottom portion 1232 in a vertical direction. The lateral portion 1234 may extend upward from the bottom portion 1232.

The inclined portion 1236 may extend from an upper end of the lateral portion 1234 in a direction toward a central axis of the outer cup 1230. The inner surface of the inclined portion 1236 may be provided to be inclined upward so as to be close to the support unit 1300. The inclined portion 1236 may be provided to have a ring shape. While a treatment process is performed on the substrate W, the upper end of the inclined portion 1236 may be located in a higher position than the substrate W supported on the support unit 1300.

An inner lifting member 1242 and the outer lifting member 1244 may raise and lower the inner cup 1210 and the outer cup 1230, respectively. The inner lifting member 1242 may be coupled to the inner cup 1210, and the outer lifting member 1244 may be coupled to the outer cup 1230 to raise or lower the inner cup 1210 and the outer cup 1230, respectively.

The support unit 1300 may support and rotate the substrate W. The support unit 1300 may be a chuck which supports and rotates the substrate W. The support unit 1300 may include the support plate 1310, the rotation shaft 1330, and a rotation driver 1350. The support plate 1310 may have a seating surface on which the substrate W is seated. The support plate 1310 may have a circular shape when viewed from above. When viewed from above, the support plate 1310 may have a smaller diameter than the substrate W. A suction hole (not shown) may be formed at the support plate 1310, and the support plate 1310 may clamp the substrate W by a vacuum pressure. Alternatively, an electrostatic plate (not shown) may be provided at the support plate 1310 to clamp the substrate W by an electrostatic attraction. Alternatively, support pins for supporting the substrate W are provided at the support plate 1310, so that the support pins may physically contact with the substrate W to clamp the substrate W.

The rotation shaft 1330 may be coupled with the support plate 1310. The rotation shaft 1330 may be coupled with a lower surface of the support plate 1310. The rotation shaft 1330 may be provided such that its lengthwise direction is parallel to the up/down direction. The rotation shaft 1330 may be rotated by power transmitted from the rotation driver 1350. Accordingly, the rotation shaft 1330 may rotate the support plate 1310. The rotation driver 1350 may vary the rotation speed of the rotation shaft 1330. The rotary driver 1350 may be a motor that provides a driving force. However, the inventive concept is not limited thereto, and the rotation driver 1350 may be implemented with various well-known apparatus that provide a driving force.

The flow supply unit 1400 may supply an air flow into the inner space 1102. The flow supply unit 1400 may supply a downward air flow into the inner space 1102. The flow supply unit 1400 may supply an air flow, the temperature and/or humidity of which are adjusted, into the inner space. The flow supply unit 1400 may be installed in the housing 1100. The flow supply unit 1400 may be provided over the processing container 1200 and the support unit 1300. The flow supply unit 1400 may include a fan 1410, a flow supply line 1430, and a filter 1450. The flow supply line 1430 may supply an outside air flow, temperature and/or humidity of which are adjusted, into the inner space 1102. The filter 1450 is installed at the flow supply line 1430 to remove impurities contained in the outside air flow that flows in the flow supply line 1430. In addition, the fan 1410, when operated, may uniformly deliver the outside air flow supplied by the flow supply line 1430 into the inner space 1102.

The liquid supply unit 1500 may supply a treatment liquid PR to the substrate W supported on the support unit 1300. The processing liquid supplied to the substrate W by the liquid supply unit 1500 may be a coating liquid. For example, the coating liquid may be a photosensitive liquid such as a photoresist. In addition, the liquid supply unit 1500 may supply a prewetting liquid to the substrate W supported on the support unit 1300. The prewetting liquid TH supplied to the substrate W by the liquid supply unit 1500 may be a liquid capable of changing the surface properties of the substrate W. For example, the prewetting solution TH may be a thinner that can change the surface properties of the substrate W to hydrophobic properties.

The liquid supply unit 1500 may include a prewetting nozzle 1510, a treatment liquid nozzle 1530, an arm 1540, a guide rail 1550, and a driver 1560.

The prewetting nozzle 1510 may supply the above-described prewetting liquid TH to the substrate W. The prewetting nozzle 1510 may supply the prewetting liquid TH to the substrate W in a manner of a stream. The treatment liquid nozzle 1530 may supply the above-described treatment liquid PR to the substrate W. The treatment liquid nozzle 1530 may be a coating liquid nozzle that supplies a coating liquid such as the above-described photoresist. The treatment liquid nozzle 1530 may supply the treatment liquid PR to the substrate W in a manner of a stream.

The arm 1540 may support the prewetting nozzle 1510 and the treatment liquid nozzle 1530. The prewetting nozzle 1510 and the treatment liquid nozzle 1530 may be installed at one end portion of the arm 1540. The prewetting nozzle 1510 and the treatment liquid nozzle 1530 may be installed on a lower surface of one end portion of the arm 1540, respectively. When viewed from above, the prewetting nozzle 1510 and the treatment liquid nozzle 1530 may be arranged in a direction parallel to the lengthwise direction of the guide rail 1550 to be described later. An opposite end portion of the arm 1540 may be coupled with the driver 1560. The arm 1540 may be moved by a driver 1560 that moves the arm 1540. Accordingly, the positions of the prewetting nozzle 1510 installed at the arm 1540 and the treatment liquid nozzle 1530 may be changed. The arm 1540 may be guided and moved along the guide rail 1550 at which the driver 1560 is installed. The guide rail 1550 may be provided such that its lengthwise direction is parallel to a horizontal direction. For example, the guide rail 1550 may be provided such that its lengthwise direction is parallel to the first direction 12. Selectively, the arm 1540 may be coupled to a rotation shaft having a lengthwise direction parallel to the third direction 16 and rotate. The rotation shaft may be rotated by a driver. Accordingly, the positions of the prewetting nozzle 1510 and the treatment liquid nozzle 1530 installed in the arm 1540 may be changed.

The controller 1900 may control the substrate processing apparatus 10. For example, the controller 1900 may control the substrate processing apparatus 1000 provided in the liquid treatment chamber 360. The controller 1900 may control the substrate processing apparatus 1000 to perform a liquid treatment process on the substrate W in the liquid treatment chamber 360. The controller 1900 may control the substrate processing apparatus 1000 to perform a coating process of forming a liquid layer on the substrate W at the liquid treatment chamber 360.

Referring again to FIG. 2 and FIG. 3, a plurality of buffer chambers 312 and 316 are provided. Some of the buffer chambers 312 and 316 are disposed between the index module 100 and the transfer chamber 350. Hereinafter, these buffer chambers are referred to as the front buffers 312. The plurality of front buffers 312 are stacked one above another along the up/down direction. Some of the other buffer chambers 312 and 316 are disposed between the transfer chamber 350 and the interface module 500. These buffer chambers are referred to as the rear buffers 316. The plurality of rear buffers 316 are stacked one above another along the up/down direction. Each of the front buffers 312 and the rear buffers 316 temporarily store a plurality of substrates W. The substrates W stored in the front buffer 312 are loaded or unloaded by the index robot 132 and the transfer robot 352. The substrates W stored in the rear buffer 316 are loaded or unloaded by the transfer robot 352 and the first robot 552.

In addition, a first front buffer robot 314 and a second front buffer robot 315, which transfer the substrate W between the front buffers 312 are provided at one side and opposite side of the front buffer 312, respectively. The first front buffer robot 314 and the second front buffer robot 315 may be symmetrically located with interposing the front buffer 312 therebetween when viewed from above. In addition, each of the first front buffer robots 314 and the second front buffer robots 315 may have a transfer hand. In addition, the first front buffer robot 314 and the second front buffer robot 315 may be provided at different heights.

In addition, a first rear buffer robot 318 and a second rear buffer robot 319, which transfer the substrate W between the rear buffers 316 may be provided at one side and an opposite side of the rear buffer 316, respectively. The first rear buffer robot 318 and the second rear buffer robot 319 may be symmetrically located with interposing the rear buffer 316 therebetween when viewed from above. In addition, each of the first front rear robots 318 and the second rear buffer robots 319 may have a transfer hand. In addition, the first rear buffer robot 318 and the second rear buffer robot 319 may be provided at different heights.

The developing block 300b includes a heat treatment chamber 320, a transfer chamber 350, and a liquid treatment chamber 360. The heat treatment chamber 320 of the developing block 300b and the transfer chamber 350 are provided in a structure and an arrangement substantially similar to those of the heat treatment chamber 320 of the coating block 300a and the transfer chamber 350, and thus description thereabout will be omitted. The liquid treatment chambers 360 in the developing block 300b are provided as developing chambers 360, all of which identically supply a developing liquid to perform a developing process on the substrate W.

The interface module 500 connects the processing module 300 with an external exposure apparatus 700. The interface module 500 has an interface frame 510, an additional process chamber 520, an interface buffer 530, and an interface robot 550.

A fan filter unit that forms a downward air flow may be provided at an upper end of the interface frame 510. The additional process chamber 520, the interface buffer 530, and the interface robot 550 are disposed within the interface frame 510. The additional process chamber 520 may perform a predetermined additional process before the substrate W treated in the coating block 300a is transferred to the exposure apparatus 700. Selectively, the additional process chamber 520 may perform a predetermined additional process before the substrate W treated in the exposure apparatus 700 is transferred to the developing block 300b. In an embodiment, the additional process may be an edge exposing process of exposing the edge region of the substrate W, a top side cleaning process of cleaning the top side of the substrate W, or a backside cleaning process of cleaning the backside of the substrate W. A plurality of additional process chambers 520 may be provided, and the additional process chambers 520 may be stacked one above anther. All of the additional process chambers 520 may be provided to perform the same process. Selectively, some of the additional process chambers 520 may be provided to perform different processes.

The interface buffer 530 provides a space in which the substrate W transferred between the coating block 300a, the additional process chamber 520, the exposure apparatus 700, and the developing block 300b temporarily stays while being transferred. A plurality of interface buffers 530 may be provided, and the plurality of interface buffers 530 may be stacked one above another.

In an embodiment, the additional process chambers 520 may be disposed on one side of an extension line facing the lengthwise direction of the transfer chamber 350, and the interface buffer 530 may be disposed on an opposite side of the extension line.

The interface robot 550 transfers the substrate W between the coating block 300a, the additional process chamber 520, the exposure apparatus 700, and the developing block 300b. The interface robot 550 may have a transfer hand for transferring the substrate W. The interface robot 550 may be provided singularly or as a plurality of robots. In an embodiment, the interface robot 550 has a first robot 552 and a second robot 554. The first robot 552 may be provided to transfer the substrate W between the coating block 300a, the additional process chamber 520, and the interface buffer 530, and the second robot 554 may transfer the substrate W between the interface buffer 530 and the exposure apparatus 700, and the second robot 554 may transfer the substrate W between the interface buffer 300b and the developing block 300b.

Each of the first robot 552 and the second robot 554 includes a transfer hand on which the substrate W is placed, and the hand may be provided to be movable forwardly and backwardly, rotatable with respect to an axis parallel to the third direction 16, and movable along the third direction 16.

Hereinafter, the transfer hand according to an embodiment of the inventive concept will be described.

A first transfer hand 2000 according to an embodiment of the inventive concept described below may be a transfer hand provided by the interface robot 550. However, the inventive concept is not limited thereto, and the first transfer hand 2000 according to an embodiment of the inventive concept described below may be a transfer hand of the index robot 132, the first front buffer robot 314, the second front buffer robot 315, the first rear buffer robot 318, the second rear buffer robot 318, and the transfer robot 352.

Figure 8:
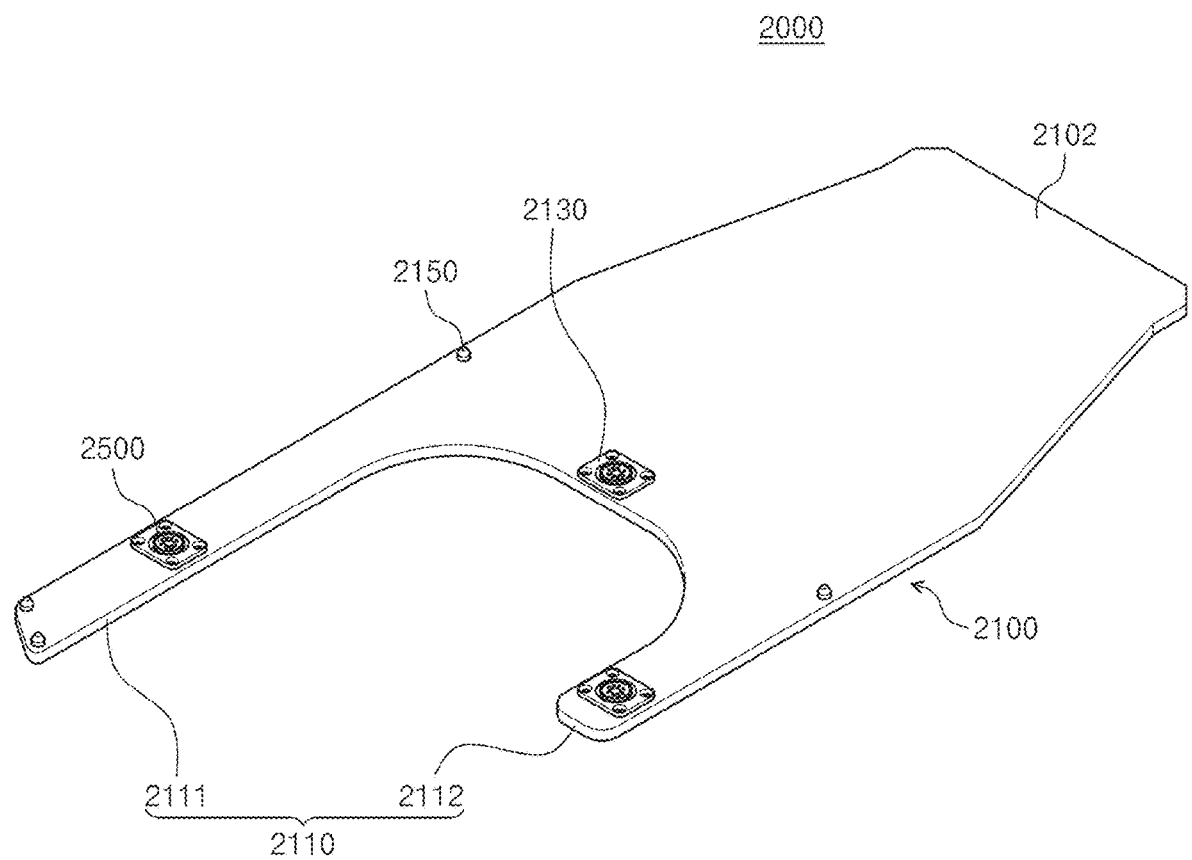
FIG. 8 is a perspective view illustrating a shape of a transfer hand according to an embodiment of the inventive concept.

FIG. 8 illustrates the transfer hand according to an embodiment of the inventive concept. Specifically, FIG. 8 illustrates the first transfer hand 2000 according to an embodiment of the inventive concept. Referring to FIG. 8, the first transfer hand 2000 according to an embodiment of the inventive concept may include a first body 2100, a first vacuum line 2400 (see FIG. 10), and a first vacuum assembly 2500.

The first body 2100 may be coupled to a driver of the interface robot 550 to be changeable in position. In addition, the first body 2100 may be provided as a conductive material. For example, the first body 2100 may be provided as a material including metal. In addition, the first body 2100 may be grounded. When the charged substrate W is seated on the first transfer hand 2000, the grounded first body 2100 may provide at least a part of the discharging path for removing static electricity of the charged the substrate W.

In addition, the first body 2100 may include a first main body 2102, a first finger 2110, a first base 2130, and a support pin 2150.

The first main body 2102 may be grounded. In addition, a first base 2130 on which a first conductive ring 2550 to be described later is placed may be installed at the first main body 2102. A detailed structure of the first base 2130 will be described later.

In addition, the first body 2100 may have at least one first finger 2110. For example, the first finger 2110 may extend from the first main body 2102 and formed integrally with the first main body 2102. In addition, the first body 2100 may have a 1-1 finger 2111 and a 1-2 finger 2112. The 1-1 finger 2111 and the 1-2 finger 2112 may have different lengths. For example, the 1-1 finger 2111 may have a length longer than that of the 1-2 finger 2112.

The support pin 2150 may be installed on the first main body 2102 or the first finger 2110. The support pin ad may support a lower surface of the substrate W. In addition, the support pin 2150 may support the lower surface of the substrate W so that when the first vacuum assembly 2500 to be described later adsorbs and supports the substrate W, the substrate W may be more stably supported. In addition, at least one support pin 2150 may be installed on an upper surface of the first main body 2102 or an upper surface of the first finger 2110. For example, a plurality of support pins 2150 may be installed on an upper surface of the first main body 2102 or an upper surface of the first finger 2110. In addition, a plurality of support pins 2150 may be installed on an e upper surface of the first main body 2102 or an upper surface of the first finger 2110, and at least some of the support pins 2150 may be installed on at least one of the first fingers 2110. For example, at least some of the support pins 2150 may be installed on an upper surface of the 1-1 finger 2111. Although FIG. 8 shows that the number of support pins 2150 is 4, the inventive concept is not limited thereto, and the number of support pins 2150 may be variously modified so as to support stably the substrate W. In addition, FIG. 8 illustrates that at least some of the support pins 2150 are installed on at an upper surface of the 1-1 finger 211, but the inventive concept is not limited thereto, and the position where the support pin 2150 is installed may be variously modified so as to support stably the substrate W.

In addition, the first vacuum assembly 2500 may be installed on the first body 2100. In addition, the first vacuum assembly 2500 may adsorb and support the substrate W. The first vacuum assembly 2500 may vacuum-adsorb the lower surface of the substrate W to support the substrate W thereon. In addition, the first vacuum assembly 2500 may be electrically connected to the grounded first body 2100. Accordingly, the first vacuum assembly 2500 may form at least a part of the discharging path for removing static electricity charged on the substrate W.

Figure 9:
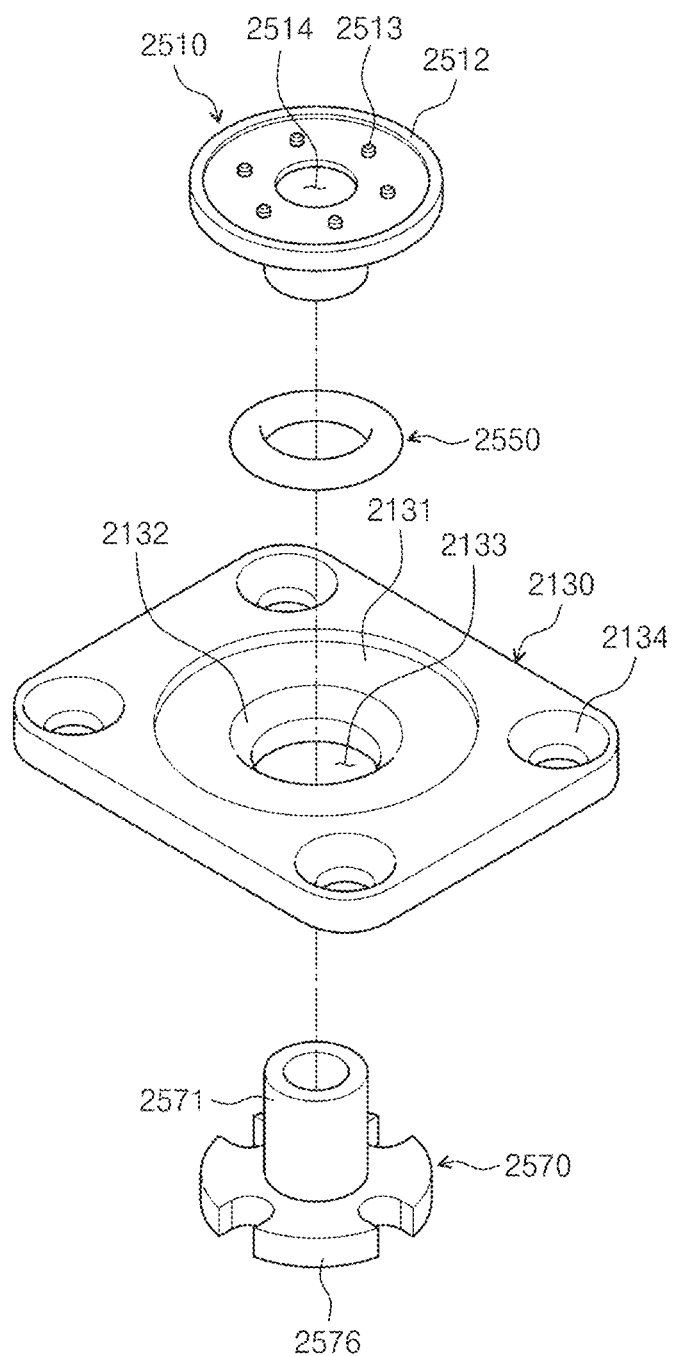
FIG. 9 is a decomposed perspective view illustrating a vacuum assembly of FIG. 8 and a base included in the body.
Figure 10:
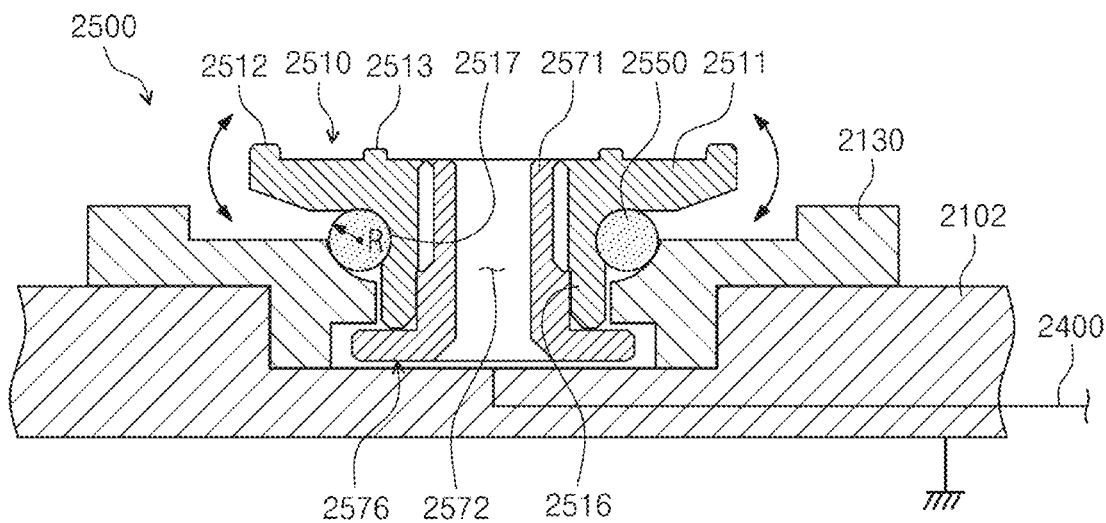
FIG. 10 is a cross-sectional view illustrating a portion of the transfer hand of FIG. 8.

FIG. 9 shows the vacuum assembly of FIG. 8 and the base included in the body, and FIG. 10 shows a part of the transfer hand of FIG. 8. Specifically, FIG. 9 and FIG. 10 illustrate the first vacuum assembly 2500 of the first transfer hand 2000 and a first base 2130 included in the first body 2100 according to an embodiment of the inventive concept.

First, the first bases 2130 may be coupled to the first main body 2102 and/or the first finger 2110. The first bases 2130 may be coupled to the grounded first main body 2102 and/or the grounded first finger 2110. In addition, the first base 2130 may be electrically connected to the grounded first main body 2102 or the grounded first finger 2110. A first vacuum pad 2510 and a first conductive ring 2550 of the first vacuum assembly 2500 to be described later may be disposed at the first base 2130. For example, the first conductive ring 2550 to be described later may be disposed between the first vacuum pad 2510 and the first base 2130. The first conductive ring 2550 may be in contact with the first vacuum pad 2510 and the first base 2130 to be electrically connected thereto.

When viewed from above, the first base 2130 may have a substantially rectangular shape, and first coupling holes 2134 may be formed at corner parts of the first base 2130, respectively. A fixing means (not shown) such as a screw or a bolt may be inserted into the first coupling holes 2134, and the fixing means may fixedly couple the first base 2130 to the first main body 2102 and/or the first finger 2110.

In addition, when viewed from above, a first insertion hole 2133 may be formed in a central region of the first base 2130. A first insertion portion 2516 of the first vacuum pad 2510 to be described later and a first body portion 2571 of a first fixing member 2570 to be described later may be inserted into the first insertion hole 2133 from opposite sides.

Also, in the central region of the first base 2130, when viewed from above, a first indentation part 2131 recessed downward from the first base 2130 may be formed. In addition, a first seating portion 2132 on which the first conductive ring 2550 to be described later is seated may be formed at the first base 2130 to be bent (concave) in a downward direction from the first indentation part 2131.

In addition, the first base 2130 may be provided as a conductive material. For example, the first base 2130 may be provided as a material including metal. For example, the first base 2130 may be provided as a material including aluminum, and the surface of the first base 2130 may be coated with a material including nickel Ni. In addition, the first base 2130 may be provided as a material having a resistance value smaller than that of the first vacuum pad 2510 to be described later and the first conductive ring 2550 to be described later. In addition, the first bases 2130 may be electrically connected to the first main body 2102 and/or the first finger 2110 described above, and may be electrically connected to the first conductive ring 2550 disposed on the first seating portion 2132.

The first vacuum assembly 2500 may have the first vacuum pad 2510, the first conductive ring 2550, and the first fixing member 2570.

The first vacuum pad 2510 may be in contact with the substrate W. For example, the first vacuum pad 2510 may be in contact with the lower surface of the substrate W. The first vacuum pad 2510 may be provide with a first head portion 2511, a first insertion portion 2516, and a first contact portion 2517.

The first head portion 2511 may be in contact with the lower surface of the substrate W. The first insertion portion 2516 may be inserted into the first insertion hole 2133 of the first base 2130. In addition, the first contact portion 2517 may be in contact with the first conductive ring 2550 to be described later.

In addition, the first contact portion 2517 may have a curved shape. For example, when viewed from cross-sections of the first contact portion 2517 and the first conductive ring 2550, a radius of a curvature of the first conductive ring 2550 may have the same size as a radius of a curvature of the first contact portion 2517. As described above, since a radius of a curvature R of the first conductive ring 2550 and a radius of a curvature of the first contact portion 2517 are the same as each other, the contact areas between the first conductive ring 2550 and the first conductive ring 2550 may be increased. Accordingly, it is possible to more effectively remove static electricity charged on the substrate W.

In addition, a first penetration hole 2514 may be formed at the first vacuum pad 2510. The first penetration hole 2514 may form at least a part of the decompression path to the lower surface of the substrate W. The first through hole 2514 of the first vacuum pad 2510 may be formed in a central region of the first vacuum pad 2510 when viewed from above. For example, the first penetration hole 2515 may extend from an upper surface of the first vacuum pad 2510 to a lower surface of the first vacuum pad 2510. The first body portion 2571 of the first fixing member 2570 to be described later may be inserted into the first penetration hole 2514. In addition, the first penetration hole 2514 is provided at the first body 2100 and may communicate with the first vacuum line 2400 providing decompression to the lower surface of the substrate W. Accordingly, the decompression provided by the first vacuum line 2400 may be transferred to the lower surface of the substrate W through the first penetration hole 2514, and thus the substrate W may be adsorbed and supported on the first transfer hand 2000.

In addition, a first ring protrusion 2512 may be formed on an upper surface of the first vacuum pad 2510. The first ring protrusion 2512 may be formed in an upper edge region of the first vacuum pad 2510. For example, when viewed from above, the first ring protrusion 2512 may be formed along the outer circumference of the upper surface of the first vacuum pad 2510. The first ring protrusion 2512 may form a vacuum region in a space between the lower surface of the substrate W and the first vacuum pad 2510 so that a decompression provided by the first vacuum line 2400 is delivered sufficiently to the lower surface of the substrate W.

In addition, a first support protrusion 2513 may be formed on the upper surface of the first vacuum pad 2510. A plurality of first support protrusions 2513 may be formed on the upper surface of the first vacuum pad 2510. When viewed from above, the first support protrusions 2513 may be formed inside the first ring protrusion 2512 and on an upper surface of the first vacuum pad 2510. In addition, when viewed from above, the first support protrusions 2513 may be arranged to be spaced apart from each other at the same interval along the circumferential direction on the upper surface of the first vacuum pad 2510. In addition, an upper end height of the first support protrusion 2513 may be lower than an upper end height of the first ring protrusion 2512. Accordingly, when the first vacuum line 2400 provides a decompression, the first ring protrusion 2512, the upper surface of the first vacuum pad 2510, and the lower surface of the substrate W may form a vacuum region, and the vacuum region may be maintained at a negative pressure by the decompression provided by first vacuum line 2400. Accordingly, the substrate W may be properly supported and chucked by the first transfer hand 2500. Furthermore, since the first support protrusion 2513 is provided inside the first ring protrusion 2512, grooves may be defined between the first support protrusion 2513 and/or between the first support protrusion 2512 and the first ring protrusion 2512. Accordingly, when the first vacuum line 2400 stops providing decompression, air easily enters the grooves and thus, the substrate W may be easily separated from the first vacuum pad 2510. Furthermore, when the first vacuum pad 2510 is formed of a material having a little elasticity, the first support protrusion 2513 transmits a little force to push the substrate W upward to the substrate W, so that the substrate W may be easily separated from the first vacuum pad 2510.

In addition, the first vacuum pad 2510 may be provided to be tiltable with respect to an axis horizontal to the upper surface of the first body 2100. That is, the first vacuum pad 2510 may be provided to be tiltable at a certain angle with respect to an axis perpendicular to the upper surface of the first body 2100. For example, the first vacuum pad 2510 is fixed to the first base 2130 by a first fixing member 2570, and the first conductive ring 2550, which has an O-ring having a little elasticity to be described later, is provided between the first vacuum pad 2510 and the first base 2130, so that the first vacuum pad 2510 is tiltable with respect to an upper axis of the first body 2100. For example, the first vacuum pad 2510 may be provided to be tiltable at a certain angle with respect to an axis perpendicular to the upper surface of the first body 2100.

In addition, the first vacuum pad 2510 may be provided as a conductive material. The first vacuum pad 2510 may be provided as a material including conductive plastic. For example, the first vacuum pad 2510 may be provided as a material including any one of a conductive PBI or a conductive PI. In addition, the first vacuum pad 2510 may be provided as a material having a resistance value in the range of about $10^6$ ohms/sq to $10^9$ ohms/sq. When the first vacuum pad 2510 is formed of a material with a resistance value in the range of about $10^6$ ohms/sq to $10^9$ ohms/sq, a slight electricity may flow in the first vacuum pad 2510, and thus static electricity due to friction between the substrate W and the first vacuum pad 2510 may be hardly generated.

The first conductive ring 2550 may be provided between the first base 2130 and the first vacuum pad 2510. The first conductive ring 2550 may be provided between the first base 2130 of the first body 2100 and the first vacuum pad 2510. For example, the first conductive ring 2550 may be provided above the first base 2130 and below the first head portion 2511 of the first vacuum pad 2510. In addition, the first conductive ring 2500 may be a sealing member electrically connected to the first vacuum pad 2510. The first conductive ring 2550 may be provided as an elastic material. Accordingly, the first conductive ring 2550 may improve an airtightness of a decompression path formed by the first vacuum assembly 2500 and the first body 2100. For example, the first conductive ring 2550 may improve the airtightness of a decompression path formed by the first vacuum assembly 2500 (e.g., a decompression path leading to the first penetration hole 2514 or a first vacuum hole 2572 and a first vacuum line 2400).

In addition, the first conductive ring 2550 may be electrically connected to the first vacuum pad 2510 and the first base 2130. The first conductive ring 2550 may be an O-ring having a substantially circular cross section. In addition, the first conductive ring 2550 may be provided as a conductive material. Furthermore, when viewed from the cross section of the first conductive ring 2550 and the first base 2130, a radius of a curvature R of the first conductive ring 2550 may have a size smaller than a radius of a curvature of the first seating portion 2132 provided in a curved shape. Accordingly, when the first vacuum pad 2510 is placed on the first conductive ring 2550, the first vacuum pad 2510 may have a predetermined degree of freedom (e.g., a degree of freedom of 0.5 mm or more) and thus may be tiltable.

In addition, the first conductive ring 2550 may be provided as a material through which an electric current may flow. In addition, the first conductive ring 2550 may be provided as a material having a resistance value smaller than the resistance value of the first vacuum pad 2510. For example, the first conductive ring 2550 may be provided as a material having a resistance value in the range of about $10^3$ ohms/sq to $10^4$ ohms/sq. In addition, the first conductive ring 2550 may be provided as a material having slight elasticity. For example, the first conductive ring 2550 may be provided as a material including a fluorine-based resin.

In addition, the first fixing member 2570 may prevent the first vacuum pad 2510 placed on the first base 2130 and the first conductive ring 2550 from being deviate from the first base 2130. The first fixing member 2570 may include a first main body portion 2571 inserted into the first through hole 2514 formed in the first vacuum pad 2510, and a first locking portion 2576 extending laterally from the first main body portion 2571. The first locking portion 2576 may be provided to overlap with the first base 2130 when viewed from above. For example, the first locking portion 2576 may be configured to overlap with a stepped portion formed in the bottom of the first base 2130, e.g., the first locking portion 2576 may be located at the space defined by the stepped portion of the first base 2130. Accordingly, the first fixing member 2570 may prevent the first conductive ring 2550 placed on the first base 2130 and the first vacuum pad 2510 from being separated from the first base 2130.

In addition, a first vacuum hole 2572 may be formed at the first fixing member 2570. The first vacuum hole 2572 may communicate with the first vacuum line 2400 described above. In addition, the first fixing member 2570 may be formed of the same or a similar material as the first vacuum pad 2510 described above.

Figure 11:
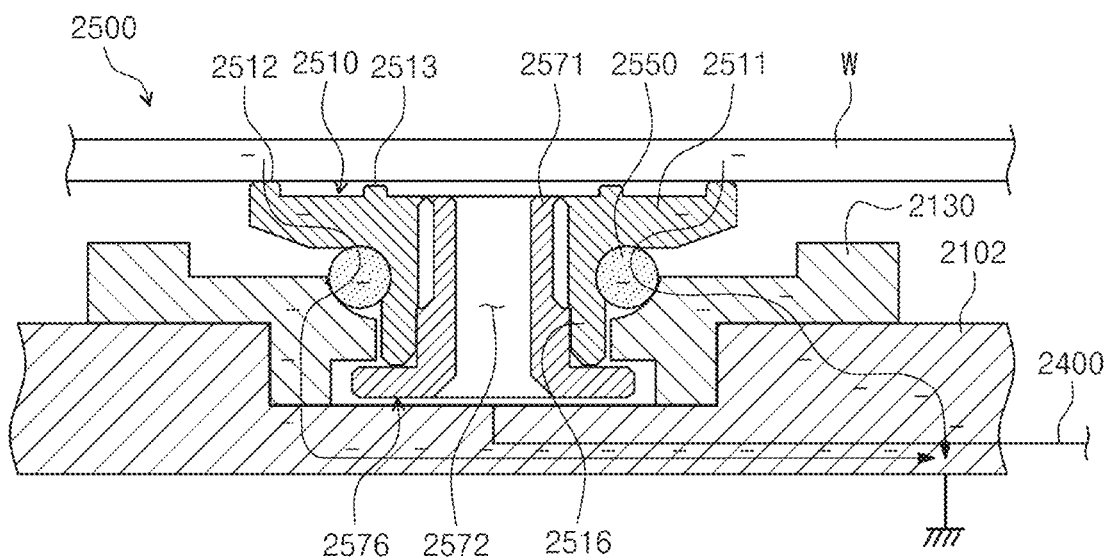
FIG. 11 is a view illustrating a state in which a substrate is placed in the transfer hand of FIG. 8.

FIG. 11 illustrates a state in which a substrate is placed on the transfer hand of FIG. 8. Referring to FIG. 11, when the substrate W is placed on the first transfer hand 2000, the first vacuum line 2400 provides decompression to the bottom surface of the substrate W. The decompression provided by the first vacuum line 2400 may be transferred to the bottom surface of the substrate W through the first vacuum hole 2572 of the first fixing member 2570 (or the first penetration hole 2514 of the first vacuum pad 2510) communicating with the first vacuum line 2400. Accordingly, the substrate W may be supported on the first transfer hand 2000 in a vacuum grip method. In addition, in some cases, though a substrate W on which a warpage is generated may be placed on the first transfer hand 2000, the first vacuum pad 2510 may be tiltable to support the substrate W as to provide a decompression to the region below the substrate W, thereby sucking/supporting the warpaged wafer W. In addition, as described above, the plurality of first support protrusions 2513 are formed on the upper surface of the first vacuum pad 2510, and when the first vacuum line 2400 stops providing decompression, the substrate W and the first vacuum pad 2510 may be more easily separated.

In addition, the first conductive ring 2550, which is an O-ring provided between the first vacuum pad 2510 and the first base 2130 in the first vacuum assembly 2500 of the present application, is made of a conductive material to form a part of a path for removing static electricity. As described above, in order to provide tiltable (movable) first vacuum pad 2510 with respect to an axis perpendicular to the upper surface of the first body 2100, an O-ring must be installed between the first base 2130 and the first vacuum pad 2510. However, when such an O-ring is provided as an insulator, a discharging path for removing static electricity of the charged substrate W may not be appropriately formed in some cases. For example, when the O-ring is provided as an insulator, the discharging path is formed by any one of the first vacuum pad 2510, the first fixing member 2570, the first base 2130, and the first main body 2102. If a warpaged substrate W is placed on the first vacuum pad 2510 or pressure is not properly provided on the bottom surface of the substrate W and thus the first vacuum pad 2510 is not appropriately seated, the first fixing member 2570 and the first main body 2102 may not be electrically connected. Similarly, since the first vacuum pad 2510 and the first base 2130 are not always in contact with each other, a discharging path for removing static electricity of the charged substrate W may not be appropriately formed in some cases. Accordingly, according to an embodiment of the inventive concept, the first conductive ring 2550, which is an O-ring provided between the first vacuum pad 2510 and the first base 2130, is made of a conductive material so as to form a part of a conductive path for static electricity of the charged substrate W.

In addition, according to an embodiment of the inventive concept, the first vacuum pad 2510 may be electrically connected to the first conductive ring 2550. In addition, the first conductive ring 2550 may be electrically connected to the first base 2130. In addition, the first base 2130 may be electrically connected to the first main body 2102. In addition, the first main body 2102 may be grounded. That is, when the charged substrate W is in contact with the first vacuum pad 2510, static electricity of the charged substrate W may be removed through any one of the first vacuum pad 2510, the first conductive ring 2550, the first base 2130, the first main body 2102, the first finger 2102 or combinations thereof.

In addition, as described above, the first vacuum pad 2510 and the first fixing member 2570 may be made with the same or similar materials. In addition, the first conductive ring 2550 may be provided as a material having a resistance value smaller than the resistance value of the first vacuum pad 2510. The first base 2130 may be provided as a material having a resistance value smaller than the resistance value of the first conductive ring 2550. In addition, the first main body 2102 may be provided as a material having a resistance value smaller than the resistance value of the first base 2130. That is, the parts may decrease in resistance value as they get closer to the grounded first main body 2102 from the substrate W. In other words, the closer the parts is to the substrate W, the greater the resistance value of the parts is. Accordingly, since the resistance value of the first vacuum pad 2510 directly contacting the substrate W is relatively larger, it is possible to minimize a problem in which static electricity of the substrate W is rapidly discharged to cause arcing. In addition, since electrical current has a property of flowing toward a smaller resistance side, the electrostatic charges may sequentially flow from the first vacuum pad 2510 with a large resistance value, the first conductive ring 2550, the first base 2130, and any one of the first main body 2102 and the first finger 2110.

Figure 12:
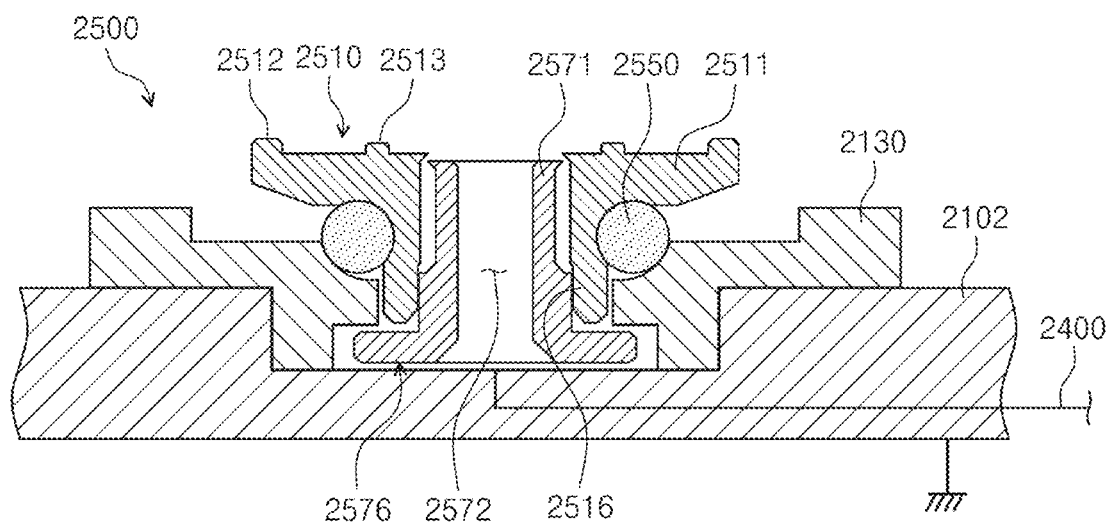
FIG. 12, FIG. 13, and FIG. 14 are views illustrating another embodiment of the vacuum assembly.
Figure 13:
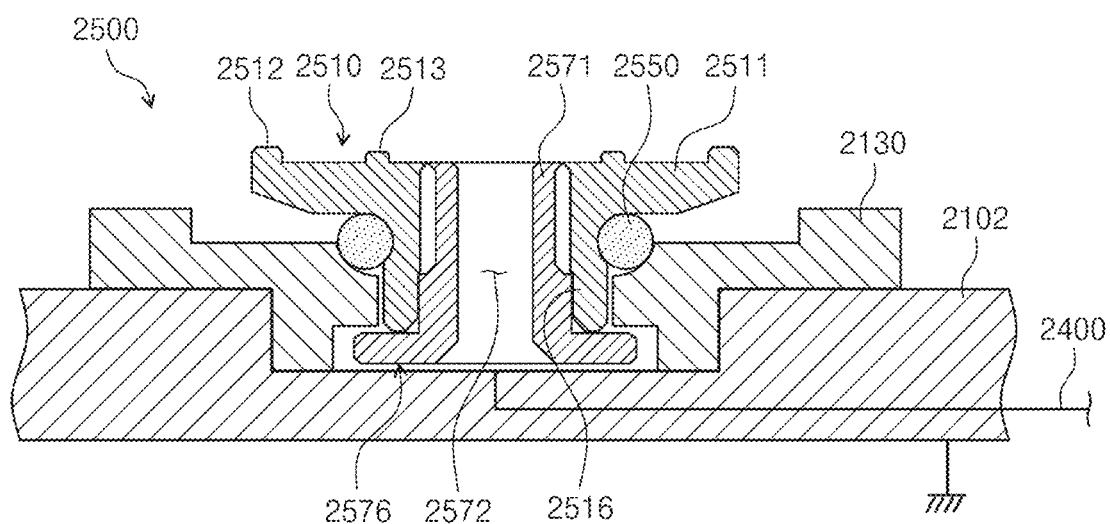
Figure 14:
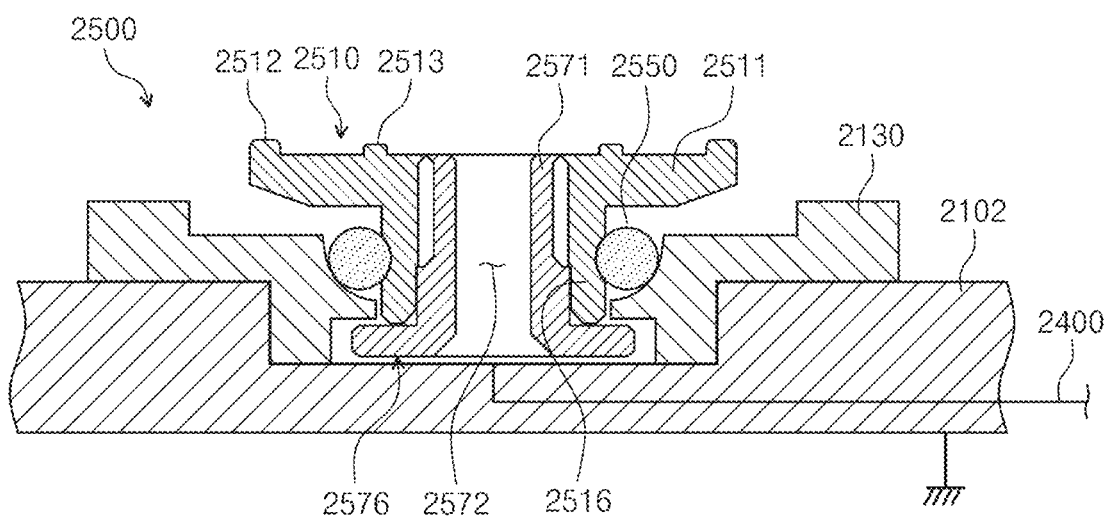

Also, as shown in FIG. 12 and FIG. 13, the ring diameter of the first conductive ring 2550 of the first vacuum assembly 2500 may be variously modified according to the size of the substrate W placed on the first transfer hand 2000. In addition, as illustrated in FIG. 14, a position where the first conductive ring 2550 is installed may be located below the first seating portion 2132.

Hereinafter, the transfer hand of another embodiment of the inventive concept is illustrated.

The second transfer hand 3000 according to another embodiment of the inventive concept described below may be a transfer hand of the transfer robot 352. Furthermore, the second transfer hand 3000 according to another embodiment of the inventive concept may be a transfer hand of at least one of the first front buffer robot 314, the second front buffer robot 315, the first rear buffer robot 318, and the second rear buffer robot 318. However, the inventive concept is not limited thereto, and the second transfer hand 3000 according to an embodiment of the inventive concept described below may be a transfer hand of the index robot 132 or the interface robot 550.

Figure 15:
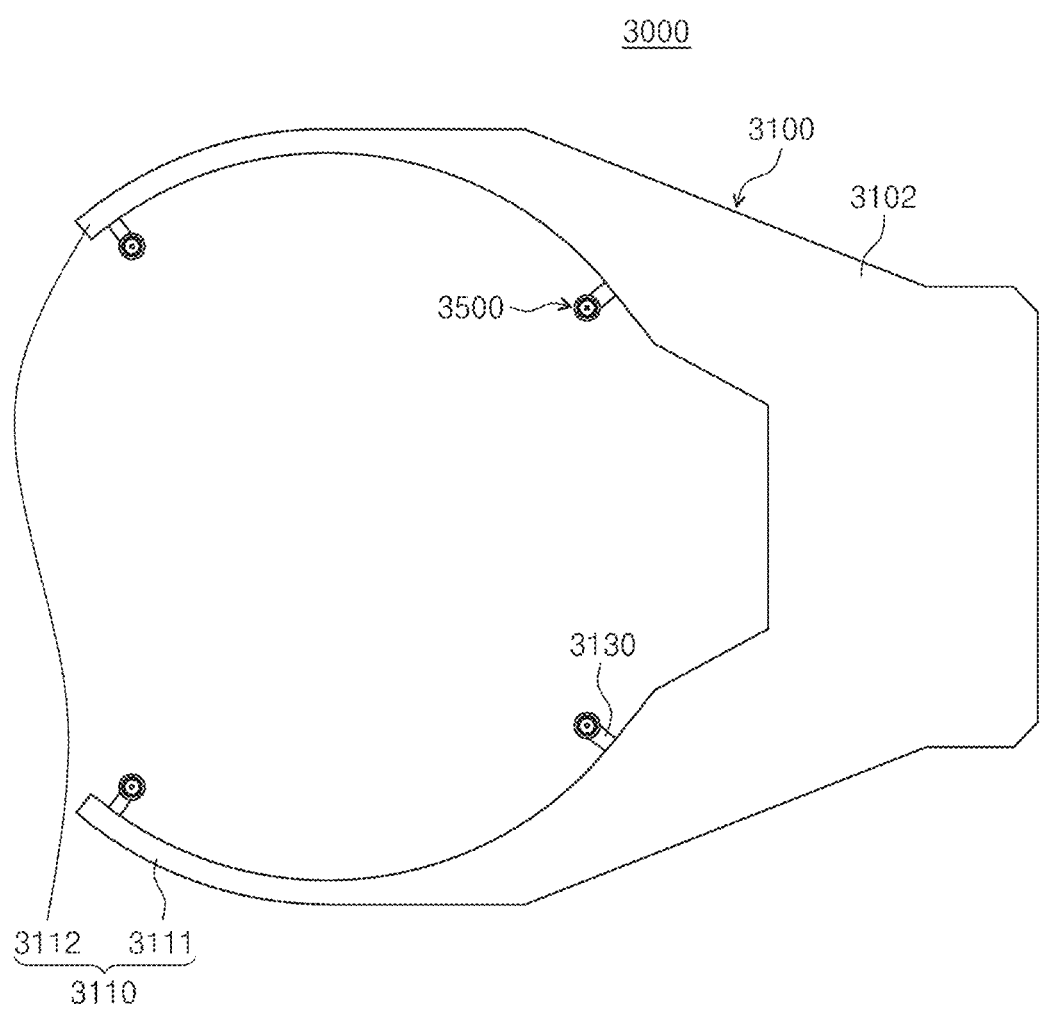
FIG. 15 is a plan view illustrating a shape of the transfer hand according to another embodiment of the inventive concept.

FIG. 15 is a plan view illustrating a shape of the transfer hand according to another embodiment of the inventive concept. Specifically, FIG. 15 illustrates a shape of the second transfer hand 3000 according to another embodiment of the inventive concept. Referring to FIG. 15, the second transfer hand 3000 according to an embodiment of the inventive concept may include a second body 3100, a second vacuum line 3400 (see FIG. 17), and a second vacuum assembly 3500.

The second body 3100 may be coupled to the transfer robot 352, the first front buffer robot 314, the second front buffer robot 315, the first rear buffer robot 318, or to a driver of the second rear buffer robot 318 to be changeable in position.

In addition, the second body 3100 may include a second main body 3102, a second finger 3110, a second base 3130, and a cover plate 3140.

The second body 3102 may be formed of a conductive material. For example, the second main body 3102 may be made of a material including metal. In addition, the second body 3102 may be grounded. When the second body 3102 is grounded and the charged substrate W is seated on the second transfer hand 3000, at least some of the discharging paths for removing static electricity of charged the substrate W may be provided. In addition, the second body 3100 may have at least one second finger 2110. For example, the second body 3100 may have a 2-1 finger 3111 and a 2-2 finger 3112. The 2-1 finger 3111 and the 2-2 finger 3112 may have the same length. For example, the 2-1 finger 3111 and the 2-2 finger 3112 may have symmetrical shapes.

In addition, the second bases 3130 may be installed on the lower surface of the second body 3102 and/or the second finger 3110. The second base 3130 may perform a function substantially the same as/similar to that of the first base 2130 described above. A detailed structure of the second base 3130 will be described later.

In addition, a second vacuum assembly 3500 may be installed at the second body 3100. In addition, the second vacuum assembly 3500 may adsorb and support the substrate W. The second vacuum assembly 3500 may vacuum-adsorb the lower surface of the substrate W to support the substrate W above the second body 3100. In addition, the second vacuum assembly 3500 may be electrically connected to the grounded second body 2100. Accordingly, the second vacuum assembly 3500 may form at least a portion of the discharging path for removing static electricity of the charged the substrate W.

Figure 16:
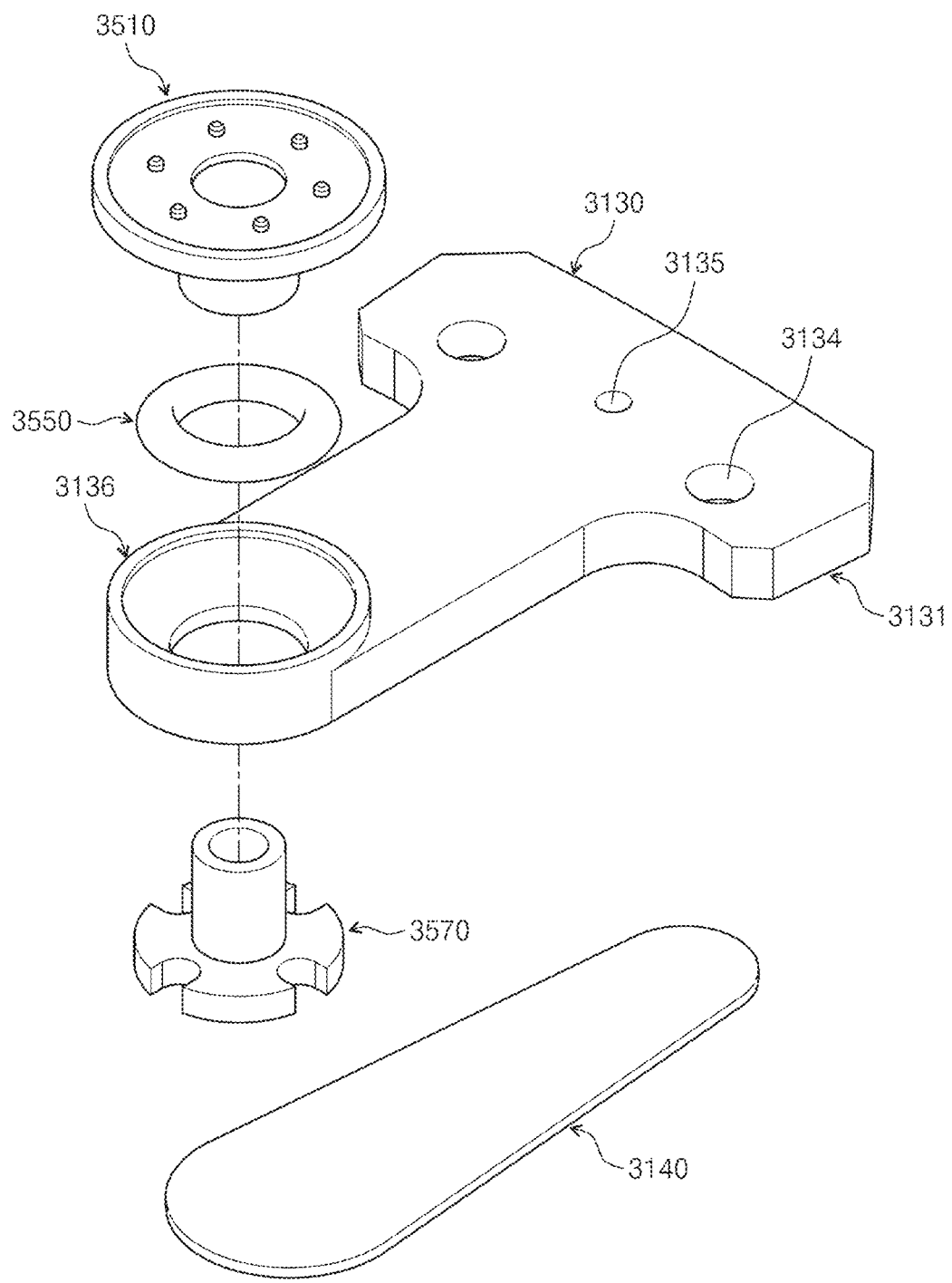
FIG. 16 is a decomposed perspective view illustrating the vacuum assembly of FIG. 15 and a base included in the body.
Figure 17:
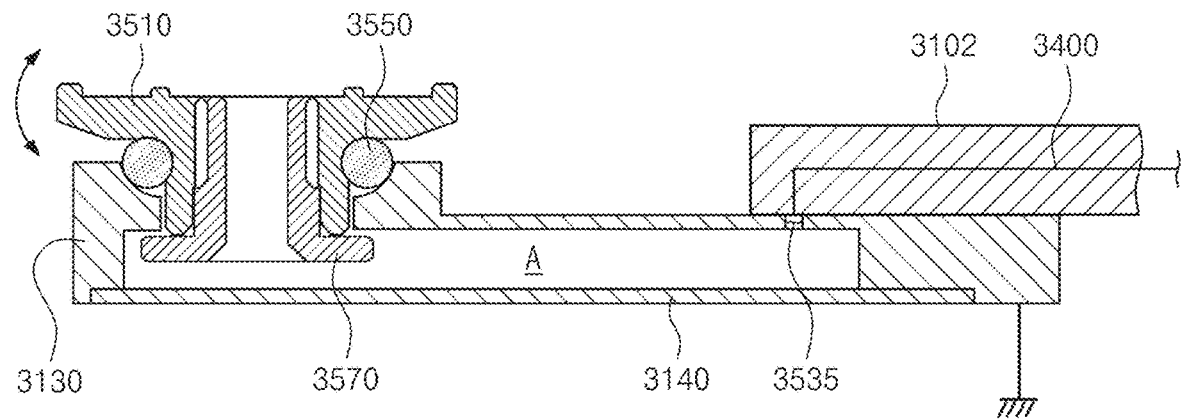
FIG. 17 is a cross-sectional view illustrating a portion of the transfer hand of FIG. 15.

FIG. 16 is an exploded view of the vacuum assembly of FIG. 15 and the base of the body, and FIG. 17 shows a part of the transfer hand of FIG. 15.

The second base 3130 may include a coupling portion 3131 coupled to the second main body 3102, and a support portion 3136 on which a second vacuum pad 3510 and a second conductive ring 3550 are placed. The coupling portion 3131 may be provided with a vacuum hole 3135 which performs the same or similar function as the first vacuum line 2400 described above and communicates with a second vacuum line 3400 provided at the second body 3100. In addition, a second coupling hole 3134 into which a coupling means for coupling the second main body 3102 and the second base 3130 to each other is inserted may be formed in the coupling part 3131.

In addition, the cover plate 3140 may be combined with the second base 3130 to form a vacuum space A. The vacuum space A may communicate with the penetration hole of the second vacuum pad 3510 or the vacuum hole of the second fixing member 3570. In addition, the cover plate 3140 may be made of a conductive material. The cover plate 3140 may be made of a material including metal. The cover plate 3140 may be made of a material including stainless steel.

The second vacuum assembly 3500 may include a second vacuum pad 3510, a second conductive ring 3550, and a second fixing member 3570. The structure and function of the second vacuum pad 3510, the second conductive ring 3550, and the second fixing member 3570 of the second vacuum assembly 3500 are substantially the same as or similar to the first vacuum pad 2510, the first conductive ring 2550, and the first fixing member 2570 of the first vacuum assembly illustrated above, thus repeated descriptions will be omitted.

Figure 18:
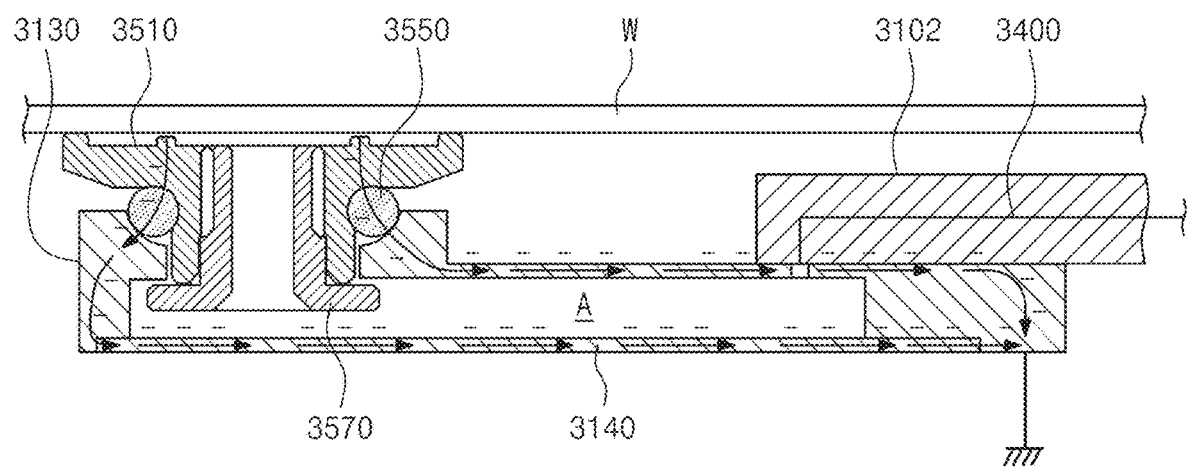
FIG. 18 is a view illustrating a state in which a substrate is placed on the transfer hand of FIG. 15.

FIG. 18 illustrates a state in which a substrate is placed at the transfer hand of FIG. 15. Referring to FIG. 18, when the charged substrate W is placed on the second transfer hand 3000, which is a transfer hand according to another embodiment of the inventive concept, static electricity of the charged substrate W may sequentially pass through the second vacuum pad 3510, the second conductive ring 3550, the second base 3130, and the grounded second body 3102 of the second vacuum assembly 3500. In addition, the decompression provided by the second vacuum line 3400 is sequentially transferred to the lower surface of the substrate W through the vacuum region A and the penetration hole of the second vacuum pad 3510 or the vacuum hole of the second fixing member 3570, thereby vacuum adsorbing and supporting the substrate W.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A transfer hand for transferring a substrate comprising:
a body; and
a vacuum assembly installed at the body and configured to provide decompression to a bottom surface of the substrate to support the substrate at an upper surface of the body,
wherein the vacuum assembly includes,
a conductive vacuum pad configured to contact the substrate,
a sealing member between the vacuum pad and the body and electrically connected to the vacuum pad,
wherein the sealing member is configured to be grounded,
a current path to ground exists from the vacuum pad through the sealing member when the vacuum pad is not in contact with the body, the current path extending from the sealing member through the body when the vacuum pad is not in contact with the body,
the sealing member is provided as a material that has a resistance value smaller than a resistance value of the vacuum pad,
the body is provided as a material that has a resistance value smaller than the resistance value of the sealing member,
the vacuum pad includes,
a head portion containing the bottom surface of the substrate;
an insertion portion inserted in the body; and
a contact portion between the head portion and the insertion portion and contacting the sealing member, and the contact portion is provided in a curved shape, and
a radius of a curvature of the sealing member in a cross-section and a radius of a curvature of the contact portion in a cross section are the same along an entirety of the contact portion,
wherein the vacuum pad comprises:
a hole in communication with a vacuum line, the vacuum line being provided in the body and configured to provide decompression to the bottom surface of the substrate; and
a ring protrusion at an edge area of an upper surface of the vacuum pad,
wherein the vacuum pad comprises at least one support protrusion at the upper surface of the vacuum pad and placed inside the ring protrusion, the support protrusion is configured to transmit force to the substrate separating the substrate from the conductive vacuum pad, and
wherein the height of a top end of the support protrusion is lower than a height of a top end of the ring protrusion.

2. The transfer hand of claim 1, wherein the vacuum pad is configured to be tiltable with respect to an axis perpendicular to an upper surface of the body.

3. The transfer hand of claim 1, wherein the body is configured to be grounded when the body is not in contact with the vacuum pad and the sealing member is electrically connected to the body and configured to be grounded when the body is not in contact with the vacuum pad.

4. A transfer hand for transferring a substrate comprising:
a body; and
a vacuum assembly installed in the body and supporting the substrate, the vacuum assembly forming at least a part of a discharging path and configured to remove electrostatic charges from the substrate;
wherein the vacuum assembly includes,
a conductive vacuum pad contacting the substrate and configured to be tiltable with respect to an axis perpendicular to an upper surface of the body,
a conductive ring provided at a lower part of the vacuum pad and electrically connected to the vacuum pad, wherein
the discharging path to ground exists from the vacuum pad through the conductive ring when the vacuum pad is not in contact with the body, the discharging path extending from the conductive ring through the body when the vacuum pad is not in contact with the body,
the conductive ring is provided as a material that has a resistance value smaller than a resistance value of the vacuum pad,
the body is provided as a material that has a resistance value smaller than the resistance value of the conductive ring, and
the vacuum pad includes, a head portion contacting a bottom surface of the substrate;
an insertion portion inserted in the body; and
a contact portion between the head portion and the insertion portion and contacting the conductive ring, and the contact portion is provided in a curved shape, and
a radius of a curvature of the conductive ring in a cross-section and a radius of a curvature of the contact portion in a cross section are the same along an entirety of the contact portion,
wherein the vacuum pad defines,
a hole in communication with a vacuum line, the vacuum line being provided in the body and configured to provide decompression to a lower surface of the substrate; and the vacuum pad comprises:
a ring protrusion at an edge area of an upper surface of the vacuum pad; and
a plurality of support protrusions provided at the upper surface of the vacuum pad and placed further inside than the ring protrusion,
wherein a height of a top end of the support protrusions is lower than a height of a top end of the ring protrusion and the plurality of support protrusions configured to transmit force to the substrate separating the substrate from the conductive vacuum pad.

5. The transfer hand of claim 4, wherein the vacuum pad is provided as a material with a resistance value in a range of about $10^6$ ohms/sq to $10^9$ ohms/sq, and
wherein the conductive ring is provided as a material with a resistance value in a range of about $10^3$ ohms/sq to $10^4$ ohms/sq.

6. The transfer hand of claim 4, wherein the support protrusions are circumferentially spaced apart from one another at the upper surface of the vacuum pad.

7. The transfer hand of claim 4, wherein the body further comprises a base with a seating portion for seating the conductive ring thereon, and
a radius of a curvature of the conductive ring in a cross-section is smaller than a radius of a curvature of the seating portion in a cross-section.

8. The transfer hand of claim 7, wherein the vacuum assembly comprises a fixing member configured to reduce the likelihood of the vacuum pad from deviating from the base,
wherein the fixing member comprises:
a main body portion inserted into a penetration hole formed at the vacuum pad; and
a locking portion extending laterally from the main body portion such that the locking portion overlaps with the base when seen from above.

9. A substrate processing apparatus comprising:
an index module with a load port on which a container configured to store a substrate is placed; and
a processing module configured to perform a treatment process on the substrate,
wherein a robot with a transfer hand for transferring the substrate is provided at the index module and/or the processing module,
wherein the transfer hand comprises:
a body with a finger, a main body, and a base installed at the finger or the main body; and
a vacuum assembly installed at the body and supporting the substrate at an upper surface of the body by vacuum pressure bottom surface of the substrate,
wherein the vacuum assembly includes,
a conductive vacuum pad contacting the substrate and provided to be tiltable with respect to an axis perpendicular to the upper surface of the body,
a conductive ring provided between the vacuum pad and the base, and contacting and electrically connecting to the vacuum pad and the base,
a head portion contacting a bottom surface of the substrate;
an insertion portion inserted in the body; and
a contact portion between the head portion and the insertion portion and contacting the conductive ring, and the contact portion is provided in a curved shape, and
a radius of a curvature of the conductive ring in a cross-section and a radius of a curvature of the contact portion in a cross section are the same along an entirety of the contact portion,
wherein the base is electrically connected to the main body or the finger, the main body or the finger configured to be grounded,
a discharging path to ground exists from the vacuum pad through the conductive ring when the vacuum pad is not in contact with the body, the discharging path extending from the conductive ring through the body when the vacuum pad is not in contact with the body,
the conductive ring is provided as a material that has a resistance value smaller than a resistance value of the vacuum pad, and
the body is provided as a material that has a resistance value smaller than the resistance value of the conductive ring,
wherein the vacuum pad defines,
a hole in communication with a vacuum line, the vacuum line being provided in the body and configured to provide decompression to a lower surface of the substrate; and the vacuum pad comprises:
a ring protrusion at an edge area of an upper surface of the vacuum pad; and
a plurality of support protrusions provided at the upper surface of the vacuum pad and placed further inside than the ring protrusion,
wherein a height of a top end of the support protrusions is lower than a height of a top end of the ring protrusion and the plurality of support protrusions configured to transmit force to the substrate separating the substrate from the conductive vacuum pad.

10. The substrate processing apparatus of claim 9, wherein the base is provided as an aluminum material, a surface of the base coated with a material including nickel,
the conductive ring is provided as a material including fluoride-based resin, and
the vacuum pad is provided as a material including a conductive plastic.

11. The substrate processing apparatus of claim 9, further comprising an interface module which connects the processing module and an outer processing apparatus which is configured to perform a treatment process different from the processing module,
wherein any one of the index module, the processing module, and the interface module is provided with a robot with the transfer hand.

* * * * *